US010928493B2

(12) United States Patent
Yamada et al.

(10) Patent No.: US 10,928,493 B2
(45) Date of Patent: Feb. 23, 2021

(54) METHOD FOR DRIVING SOLID-STATE IMAGING DEVICE

(71) Applicant: PANASONIC INTELLECTUAL PROPERTY MANAGEMENT CO., LTD., Osaka (JP)

(72) Inventors: Tohru Yamada, Kyoto (JP); Sei Suzuki, Osaka (JP); Yasuyuki Shimizu, Kyoto (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 319 days.

(21) Appl. No.: 15/885,436

(22) Filed: Jan. 31, 2018

(65) Prior Publication Data
US 2018/0156899 A1 Jun. 7, 2018

Related U.S. Application Data

(63) Continuation of application No. PCT/JP2016/003494, filed on Jul. 28, 2016.

(30) Foreign Application Priority Data

Aug. 4, 2015 (JP) .................. 2015-154512

(51) Int. Cl.
G01C 3/08 (2006.01)
G01S 7/486 (2020.01)
(Continued)

(52) U.S. Cl.
CPC .......... *G01S 7/4868* (2013.01); *G01S 7/4861* (2013.01); *G01S 7/4863* (2013.01); *G01S 7/4865* (2013.01);
(Continued)

(58) Field of Classification Search
CPC ...... H04N 5/374; H04N 5/353; H04N 5/2351; H01L 27/146; H01L 27/14856;
(Continued)

(56) References Cited

U.S. PATENT DOCUMENTS 8,754,357 B2 * 6/2014 Meynants ............... H04N 5/353
250/208.1
2006/0192938 A1 8/2006 Kawahito
(Continued)

FOREIGN PATENT DOCUMENTS

JP 2004-294420 A 10/2004
JP 2010-213231 A 9/2010
(Continued)

OTHER PUBLICATIONS

International Search Report and Written Opinion issued in International Patent Application No. PCT/JP2016/003494, dated Oct. 11, 2016; with partial English translation.
(Continued)

Primary Examiner — Mark Hellner
(74) Attorney, Agent, or Firm — McDermott Will and Emery LLP

(57) ABSTRACT

Provided is a method for driving a solid-state imaging device including a unit pixel which includes at least a first pixel including: a photoelectric converter which receives reflected light from an object and converts the reflected light into charge; an exposure resetter which switches between exposure and discharge of the charge in the photoelectric converter; and a plurality of readers which read the charge from the photoelectric converter and include at least a first reader and a second reader. The method includes: performing a first exposure as the exposure that is performed in a first period in which a gate of the first reader is ON; and performing a second exposure as the exposure that is performed
(Continued)

formed in a second period which is started in conjunction with the end of the first period and in which a gate of the second reader is ON.

19 Claims, 22 Drawing Sheets

(51) Int. Cl.
  *G01S 17/89* (2020.01)
  *H04N 5/374* (2011.01)
  *H04N 5/353* (2011.01)
  *H01L 27/146* (2006.01)
  *G01S 7/4863* (2020.01)
  *G01S 7/4865* (2020.01)
  *G01S 17/10* (2020.01)
  *G01S 7/4861* (2020.01)
  *H01L 27/148* (2006.01)
  *H04N 5/235* (2006.01)

(52) U.S. Cl.
  CPC .............. *G01S 17/10* (2013.01); *G01S 17/89* (2013.01); *H01L 27/146* (2013.01); *H01L 27/14818* (2013.01); *H01L 27/14856* (2013.01); *H04N 5/2351* (2013.01); *H04N 5/353* (2013.01); *H04N 5/374* (2013.01)

(58) Field of Classification Search
  CPC ............. H01L 27/14818; G01S 7/4861; G01S 7/4865; G01S 7/4863; G01S 17/01; G01S 17/89; G01S 17/894

USPC ........................................................ 356/5.01
  See application file for complete search history.

(56) References Cited

U.S. PATENT DOCUMENTS

| | | | |
|---|---|---|---|
| 2009/0114919 | A1 | 5/2009 | Kawahito et al. |
| 2010/0231774 | A1 | 9/2010 | Tashiro |
| 2011/0037969 | A1 | 2/2011 | Spickermann et al. |
| 2012/0268727 | A1 | 10/2012 | Schrey et al. |
| 2013/0162973 | A1 | 6/2013 | Kamiyama et al. |
| 2016/0103223 | A1 | 4/2016 | Yarino et al. |
| 2017/0289477 | A1* | 10/2017 | Nishihara ................ H04N 5/32 |

FOREIGN PATENT DOCUMENTS

| | | |
|---|---|---|
| JP | 2013-134173 A | 7/2013 |
| JP | 2013-195344 A | 9/2013 |
| WO | 2014/207788 A1 | 12/2014 |

OTHER PUBLICATIONS

Extended European Search Report issued in European Patent Application No. 16832502.5, dated Jul. 20, 2018.
Office Action and Search Report dated Feb. 3, 2020, issued in the corresponding Chinese Patent Application No. 201680045243.4; with English translation.

* cited by examiner

| ACCUMULATION Tr \ DELAY | SHORT DISTANCE 0 - 1Tp | MEDIUM DISTANCE 1Tp - 2Tp | LONG DISTANCE 2Tp - 3Tp |
|---|---|---|---|
| SG0 | S0' = S0 + BG0 | BG0 | BG0 |
| SG1 | S1' = S1 + BG1 | S0' = S0 + BG1 | BG1 |
| SG2 | BG0 | S1' = S1 + BG0 | S0' = S0 + BG0 |
| SG3 | BG1 | BG1 | S1' = S1 + BG1 |

UNIT PIXEL 10A: SG0, SG1
UNIT PIXEL 10B: SG2, SG3

UNIT PIXEL SIZE EQUIVALENT TO THAT IN RELATED ART
REDUCED OPTICAL SIZE

OPTICAL SIZE EQUIVALENT TO THAT IN RELATED ART
UNIT PIXEL SIZE TWICE THAT IN RELATED ART

| | ACCUMULATION Tr \ DELAY | SHORT DISTANCE 0 - 1Tp | MEDIUM DISTANCE 1Tp - 2Tp | LONG DISTANCE 2Tp - 3Tp | LONGER DISTANCE 3Tp - 4Tp |
|---|---|---|---|---|---|
| UNIT PIXEL 10A | SG0 | S0' = S0 + BG0 | BG0 | BG0 | S1' = S1 + BG0 |
| | SG1 | S1' = S1 + BG1 | S0' = S0 + BG1 | BG1 | BG1 |
| UNIT PIXEL 10B | SG2 | BG0 | S1' = S1 + BG0 | S0' = S0 + BG0 | BG0 |
| | SG3 | BG1 | BG1 | S1' = S1 + BG1 | S0' = S0 + BG1 |

FIG. 9D

| | ACCUMULATION Tr \ DELAY | SHORT DISTANCE 0 - 1Tp | MEDIUM DISTANCE 1Tp - 2Tp | LONG DISTANCE 2Tp - 3Tp |
|---|---|---|---|---|
| LIGHT EMISSION 1 PERIOD | SG0 | S0' = S0 + BG0 | BG0 | BG0 |
| | SG1 | S1' = S1 + BG1 | S0' = S0 + BG1 | BG1 |
| LIGHT EMISSION 2 PERIOD | SG2 | BG0 | S1' = S1 + BG0 | S0' = S0 + BG0 |
| | SG3 | BG1 | BG1 | S1' = S1 + BG1 |

UNIT PIXEL SIZE EQUIVALENT TO THAT IN RELATED ART
REDUCED OPTICAL SIZE

OPTICAL SIZE EQUIVALENT TO THAT IN EMBODIMENT 1
UNIT PIXEL SIZE TWICE THAT IN RELATED ART

OPTICAL SIZE EQUIVALENT TO THAT IN RELATED ART
UNIT PIXEL SIZE THREE TIMES THAT IN RELATED ART

| ACCUMULATION Tr \ DELAY | SHORT DISTANCE<br>0 - 1Tp | MEDIUM DISTANCE<br>1Tp - 2Tp | LONG DISTANCE<br>2Tp - 3Tp | LONGER DISTANCE<br>3Tp - 4Tp |
|---|---|---|---|---|
| LIGHT EMISSION 1 PERIOD → SG0 | S0' = S0 + BG0 | BG0 | BG0 | S1' = S1 + BG0 |
| SG1 | S1' = S1 + BG1 | S0' = S0 + BG1 | BG1 | BG1 |
| LIGHT EMISSION 2 PERIOD → SG2 | BG0 | S1' = S1 + BG0 | S0' = S0 + BG0 | BG0 |
| SG3 | BG1 | BG1 | S1' = S1 + BG1 | S0' = S0 + BG1 |

METHOD FOR DRIVING SOLID-STATE IMAGING DEVICE

CROSS REFERENCE TO RELATED APPLICATIONS

This application is a U.S. continuation application of PCT International Patent Application Number PCT/JP2016/003494 filed on Jul. 28, 2016, claiming the benefit of priority of Japanese Patent Application Number 2015-154512 filed on Aug. 4, 2015, the entire contents of which are hereby incorporated by reference.

BACKGROUND

1. Technical Field

The present disclosure relates to methods for driving solid-state imaging devices to be used in imaging for distance measurement.

2. Description of the Related Art

Among methods for sensing an object, the time of flight (TOF) method is known in which a distance is measured using flight time that light takes to travel to and return from a measurement object.

Japanese Unexamined Patent Application Publication No. 2004-294420 (Patent Literature 1) discloses a distance image sensor in which two different signal storage units store signals obtained by transfer of charge with different phases in synchronization with intermittent behavior of light from a light source, the distance to an object is determined using the distribution ratio of the stored signals, and furthermore, a third signal storage unit stores signals of background light only, and thus background light removal is performed to eliminate the impact of the background light.

SUMMARY

In a general pulse TOF method, exposure periods T1 to T3 are set to have the same length as pulse width Tp where T1 is a first exposure period starting from time of a rising edge of irradiating light having pulse width Tp, T2 is a second exposure period starting from time of a falling edge of the irradiating light, and T3 is a third exposure period in which exposure is performed in a state where the irradiating light is OFF. Suppose that the amount of signals obtained by an imager during first exposure period T1 is denoted as A0, the amount of signals obtained by the imager during second exposure period T2 is denoted as A1, the amount of signals obtained by the imager during third exposure period T3 is denoted as A2, and the speed of light (299,792,458 m/s) is denoted as c, distance L is given by the following equation.

$$L = c \times Tp/2 \times \{(A1-A2)/(A0-A2+A1-A2)\}$$

The solid-state imaging device used in the distance measurement imaging device using this TOF method repeats, more than one time, sampling that is performed for one period of the irradiating light. In the abovementioned TOF method, distance measurement range D is represented as follows.

$$D = c \times Tp/2$$

Meanwhile, in PTL 1, when a pixel that obtains background light is taken into account, a distance is calculated using three pixels as one distance measurement unit, and thus one distance measurement unit for calculating a distance is large, meaning that downsizing is difficult to achieve. Furthermore, since each pixel includes only one charge accumulator, an increase in the pulse width (To) of the light source leads to an increase in distance measurement range D, but causes a decrease in distance resolution. In other words, the distance measurement accuracy is inversely proportional to the pulse width (To) of the light source; when the pulse width (To) of the light source is increased in order to widen the distance measurement range (limit) D, conversely, the distance measurement accuracy is decreased. Furthermore, distance measurement variation becomes large as a result of variation in signals of background light due to the production tolerance of each pixel.

In view of the abovementioned problems, the present disclosure has an object to provide a method for driving a solid-state imaging device which is small, has high distance measurement accuracy, and obtains a distance measurement signal that covers a wide distance measurement range.

In order to solve the abovementioned problems, a method for driving a solid-state imaging device according to an aspect of the present disclosure is a method for driving a solid-state imaging device which captures a distance measurement image for measuring a distance to an object irradiated with a pulsed beam and includes a plurality of pixels including at least a first pixel including: a photoelectric converter which receives reflected light from the object and converts the reflected light into charge; an exposure resetter which switches between exposure and discharge of the charge in the photoelectric converter; and a plurality of readers which read the charge from the photoelectric converter and include at least a first reader and a second reader. The method for driving the solid-state imaging device includes: performing a first exposure as the exposure that is performed in a first period in which a gate of the first reader is ON; and performing a second exposure as the exposure that is performed in a second period which is started in conjunction with an end of the first period and in which a gate of the second reader is ON.

With the method for driving a solid-state imaging device according to the present disclosure, a small solid-state imaging device can obtain a distance measurement signal that covers a wide distance measurement range with high distance measurement accuracy.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 9D illustrates combinations of signals obtained by short-distance measurement, medium-distance measurement, and long-distance measurement;

DETAILED DESCRIPTION OF THE EMBODIMENTS

Underlying Knowledge Forming Basis of the Present Disclosure

The inventors have found the following problems with the distance image sensor disclosed in the Background Art section. Hereinafter, the problems will be described with reference to the drawings.

In the distance image sensor disclosed in PTL 1, three unit pixel groups are used in such a way that three exposure processes are performed at different timings for one light emission and reflected light thereof, and thus distance information is obtained from such three exposure signals for each set of three unit pixels (=distance measurement pixels).

Figure 15A:
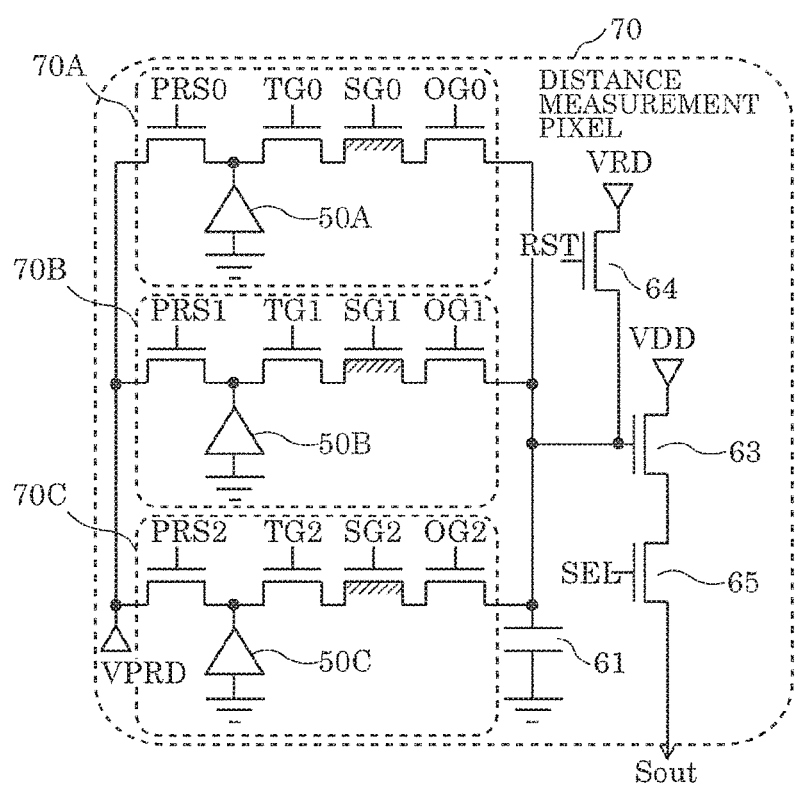
FIG. 15A is a schematic configuration view of a conventional distance measurement pixel which obtains distance measurement information using three unit pixels.
Figure 15B:
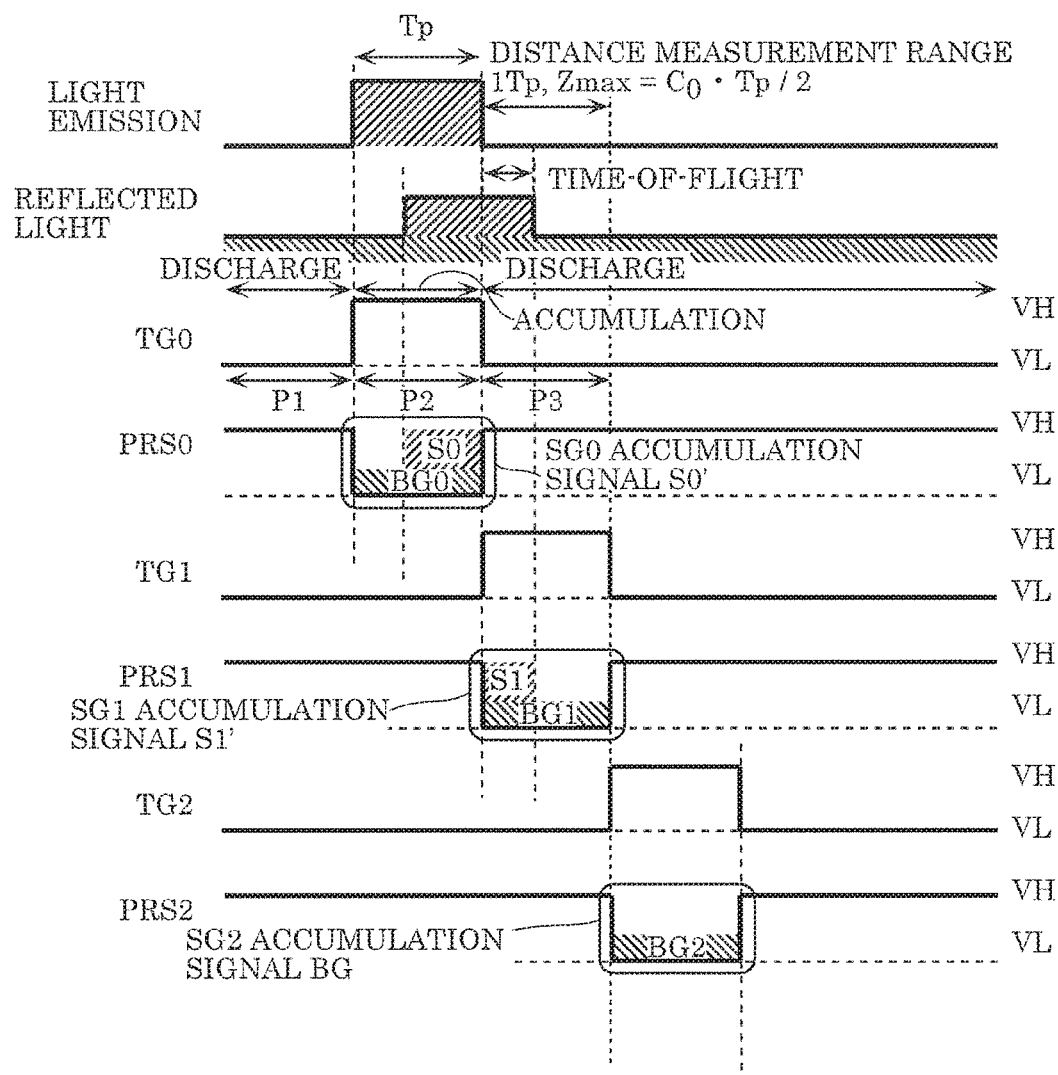
FIG. 15B is a timing chart for describing distance measurement driving of a conventional distance measurement device.
Figure 16:
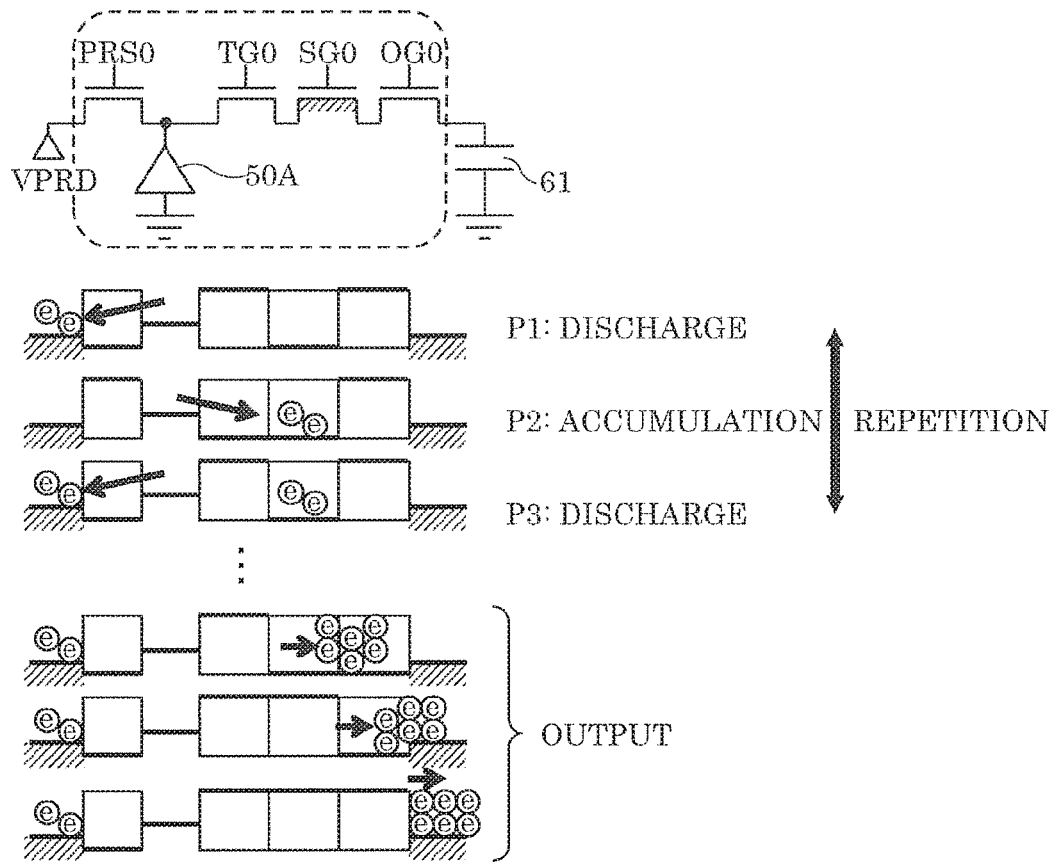
FIG. 16 illustrates transitions of a pixel potential distribution at the time of distance measurement driving of a conventional distance measurement device.

FIG. 15A is a schematic configuration view of a conventional distance measurement pixel which obtains distance measurement information using three unit pixels. FIG. 15B is a timing chart for describing distance measurement of a conventional distance measurement device. FIG. 16 illustrates transitions of a pixel potential distribution at the time of distance measurement driving of the conventional distance measurement device. In FIG. 15A, structural elements of three unit pixels 70A, 70B, and 70C are illustrated, and three unit pixels 70A, 70B, and 70C form one distance measurement pixel 70. Unit pixel 70A includes one photoelectric conversion element 50A, read gate TG0, charge accumulation gate SG0, output gate OG0, and exposure reset gate PRS0. Unit pixel 70B includes one photoelectric conversion element 50B, a read gate TG1, charge accumulation gate SG1, output gate OG1, and exposure reset gate PRS1. Unit pixel 70C includes one photoelectric conversion element 50C, read gate TG2, charge accumulation gate SG2, output gate OG2, and exposure reset gate PRS2. Furthermore, distance measurement pixel 70 includes: floating diffusion (FD) 61 which is shared by three unit pixels 70A, 70B, and 70C; amplification transistor 63; reset transistor 64; and selection transistor 65.

In distance measurement pixel 70 having the abovementioned configuration, as illustrated in FIG. 15B, at the time of exposure of each photoelectric conversion element, the operation of starting the signal reading from the photoelectric conversion element to the charge accumulation gate and the operation of stopping the signal discharge from the photoelectric conversion element to drain VPRD are performed at the same time. Furthermore, the operation of stopping the signal reading from the photoelectric conversion element to the charge accumulation gate and the operation of starting the signal discharge from the photoelectric conversion element to drain VPRD are performed at the same time. Next, distance measurement driving of the conventional distance measurement device will be described.

As illustrated in FIG. 15B, first, in period P1, read gate TG0 of unit pixel 70A (S0 exposure pixel) is OFF, exposure reset gate PRS0 is ON, and signal charge of photoelectric conversion element 50A is discharged to drain VPRD (P1 in FIG. 16: discharge).

Next, in period P2, in synchronization with switching ON of a light emission pulse, read gate TG0 is switched ON (VL to VH), and exposure reset gate PRS0 is switched OFF (VH to VL); thus, the signal charge of photoelectric conversion element 50A is transferred to charge accumulation gate SG0 and accumulated therein (P2 in FIG. 16: accumulation).

Next, in synchronization with switching OFF of the light emission pulse, read gate TG0 is switched OFF again (VH to VL), and exposure reset gate PRS0 is switched ON (VL to VH); thus, the charge of photoelectric conversion element 50A is discharged to drain VPRD, resulting in completion of S0 exposure sequence at unit pixel 70A.

Next, in period P3, at unit pixel 70B (S1 exposure pixel), in the same manner as with unit pixel 70A, read gate TG1 is OFF, exposure reset gate PRS1 is ON, and signal charge of photoelectric conversion element 50B is discharged to drain VPRD (P3 in FIG. 16: discharge).

Next, in period P3, in synchronization with switching OFF of a light emission pulse, read gate TG1 is switched ON (VL to VH), and exposure reset gate PRS1 is switched OFF (VH to VL); thus, the signal charge of photoelectric conversion element 50B is transferred to charge accumulation gate SG1 and accumulated therein.

Next, after the lapse of the same exposure period as that of the S0 exposure at unit pixel 70A, read gate TG1 is switched OFF again (VH to VL), and exposure reset gate PRS1 is switched ON (VL to VH); thus, the charge of photoelectric conversion element 50B is discharged to drain VPRD, resulting in completion of S1 exposure sequence at unit pixel 70B.

Next, at unit pixel 70C (BG exposure pixel), in the same manner as with unit pixel 70A, read gate TG2 is OFF, exposure reset gate PRS2 is ON, and signal charge of photoelectric conversion element 50C is discharged to drain VPRD.

Next, in a period in which no reflected light pulse is present (only background (BG) light is present), read gate TG2 is switched ON (VL to VH), and exposure reset gate PRS2 is switched OFF (VH to VL); thus, the signal charge of photoelectric conversion element 50C is transferred to charge accumulation gate SG2 and accumulated therein.

Next, after the lapse of the same period as the S0 exposure period at unit pixel 70A and the same period as the S1 exposure period at unit pixel 70B, read gate TG2 is switched OFF again (VH to VL), and exposure reset gate PRS2 is switched ON (VL to VH); thus, the charge of photoelectric conversion element 50C is discharged to drain VPRD, resulting in completion of BG exposure sequence at unit pixel 70C.

The abovementioned S0 exposure sequence, S1 exposure sequence, and BG exposure sequence are repeated several hundred to several hundred thousand times, the amount of accumulated signals in a charge accumulation transistor having charge accumulation gate SG is increased, and thereafter output gate OG is switched ON so that the charge accumulated in the charge accumulation transistor is transferred, and charge accumulation gate SG is switched OFF and output gate OG is switched OFF in sequence so that all of the accumulated charge is transferred and output to FD 61.

In other words, in the above-described conventional distance measurement driving, three unit pixels form one distance measurement pixel, and distance measurement calculation is performed through one light emission and three exposure processes using three unit pixels.

Using the signals obtained by the above-described distance measurement driving, distance L to a subject can be calculated on a per-distance-measurement-pixel basis according to Equation 1 to Equation 4 below. In the equations, S0' represents the signal charge accumulated in charge accumulation gate SG0 in the S0 exposure sequence at unit pixel 70A, S1' represents the signal charge accumulated in charge accumulation gate SG1 in the S1 exposure sequence at unit pixel 70B, and BG2 represents the signal charge accumulated in charge accumulation gate SG2 in the BG exposure sequence at unit pixel 70C.

[Math. 1]

$$S0 = S0' - BG2 \quad \text{(Equation 1)}$$
$$S1 = S1' - BG2$$

$$Tp:TOF = S0 + S1:S1 \quad \text{(Equation 2)}$$

$$TOF = Tp\left(\frac{S1}{S0 + S1}\right) \quad \text{(Equation 3)}$$

$$L = \frac{c \cdot TOF}{2} = \frac{c \cdot Tp}{2}\left(\frac{S1}{S0 + S1}\right) \quad \text{(Equation 4)}$$

Since S0+S1 obtained by removing background light (BG2) components corresponds to light emission pulse width Tp and S1 is proportional to time of flight (TOF) of the reflected light, distance L to the subject can be calculated on a per-distance-measurement-pixel basis according to Equation 1 to Equation 4.

The conventional distance measurement device described above, however, has the following problems.

[Problem 1]

Figure 17:
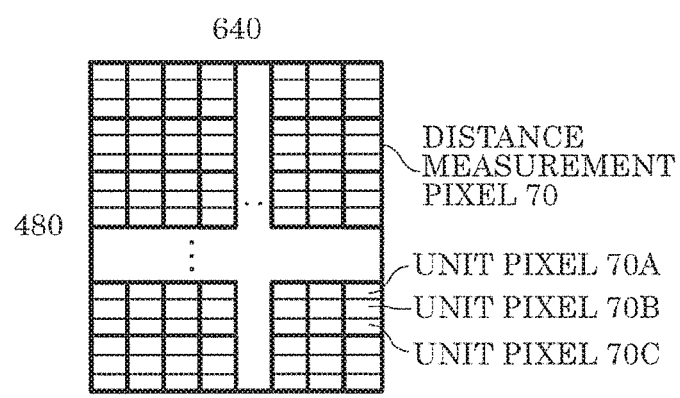
FIG. 17 illustrates the arrangement of a conventional distance measurement pixel which obtains distance measurement information using three unit pixels.

FIG. 17 illustrates the arrangement of a conventional distance measurement pixel which obtains distance measurement information using three unit pixels. Recent years have seen a sharp rise in the demand for small, high-resolution (at least QVGA) TOF sensors for a machine vision application, a gesture input application, etc., in the field of mobile, robot, and vehicle-mounted devices, for example. Accordingly, the realization of small, high-resolution TOF sensors capable of measuring a distance using miniaturized distance measurement pixels is awaited.

In the related art, however, as illustrated in FIG. 17, each unit pixel performs one accumulation, and therefore three unit pixels are needed to obtain three signals (S0', S1', BG) required for distance measurement, causing an increase in the size of the distance measurement pixel. Thus, in order to obtain high resolutions that have been demanded in recent years, such as VGA and SXGA, the optical size of the TOF sensor needs to be increased, as illustrated in FIG. 17.

[Problem 2]

As illustrated in the circuit diagram of the distance measurement pixel in FIG. 15A and the distance measurement drive timing in FIG. 15B, when S0 and S1 to be used in Equation 4 for calculating distance L are derived from Equation 1, the BG component is subtracted using BG2 accumulated in the charge accumulation transistor of unit pixel 70C. In this regard, respective background light components actually contained in S0' and S1' are signals BG0 and BG1 obtained by the exposure of unit pixel 70A and 70B, which are different from unit pixel 70C.

Therefore, when S0 and S1 are calculated using Equation 1, variations in the sensitivity of photoelectric conversion elements, the dark current, and the exposure reset pulses (exposure variations) that are caused by the production tolerance of respective unit pixels affect BG0, BG1, and BG2, resulting in increased distance measurement variations.

[Problem 3]

When the distance to the subject is great, the delay amount of the reflected light is large, and at a point in time later than the end of the exposure period for exposure reset gate PRS1, BG is mixed with the reflected light, causing a change in the values of S0 and S1 after the subtraction of BG in Equation 1; thus, the distance measurement calculation becomes inaccurate.

Therefore, in the related art, only a short distance (c·Tp/2) corresponding to 1 Tp can be measured. For example, when Tp=11 ns, maximum distance measurement range Zmax is limited to 1.65 m.

[Problem 4]

Figure 18:
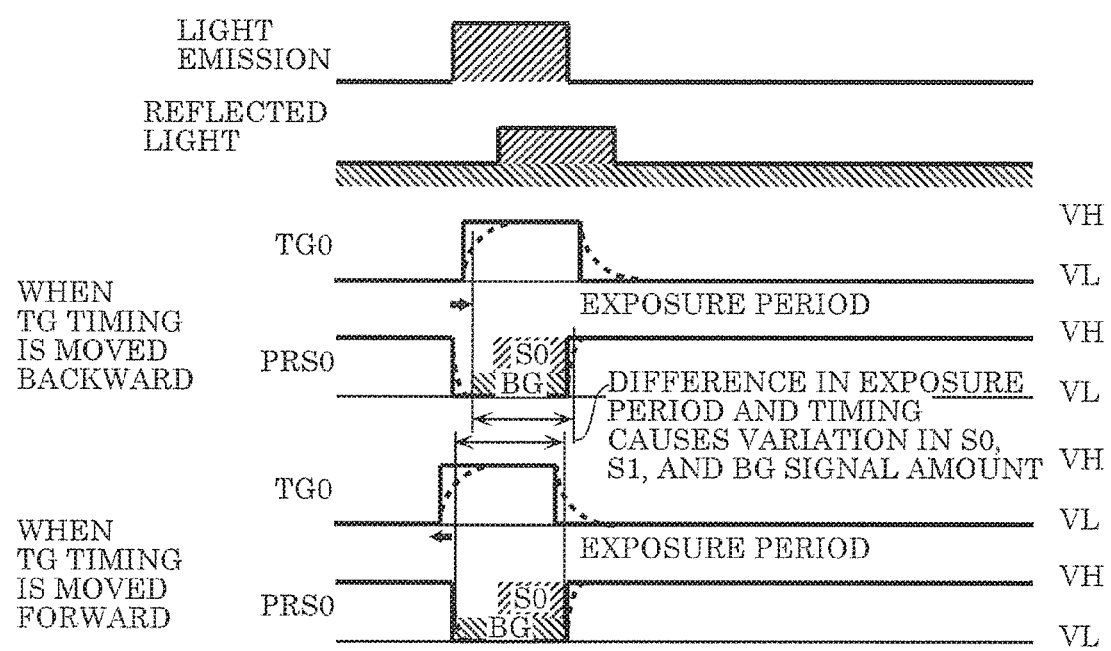
FIG. 18 is a timing chart for describing misaligned drive timing in distance measurement driving of a conventional distance measurement device.

FIG. 18 is a timing chart for describing misaligned drive timing in distance measurement driving of a conventional distance measurement device. As illustrated in FIG. 15B, in the related art, the timing at which read gate TG is switched ON and the timing at which exposure reset gate PRS is switched OFF are the same, and the timing at which the read gate is switched OFF and the timing at which exposure reset gate PRS is switched ON are the same. Since these pulses are applied from the periphery of a pixel region into the pixel region, the roundness of the pulse waveform, delayed timing, etc., cause a temporal misalignment of the ON/OFF timing for read gate TG with that of exposure reset gate PRS, as illustrated in FIG. 17, and thus there may be a large difference in exposure time, exposure timing, and the like (1 ns misalignment causes a 15 cm difference in measured distance). As a result, in the imaging plane, the amount of signals S0, S1, and BG varies, and distance measurement variations, offset, and shading occur.

The present disclosure has been conceived in order to such problems, and aims to provide a solid-state imaging device which is small, has high distance measurement accuracy, and obtains a distance measurement signal that covers a wide distance measurement range, and provide a method for driving the solid-state imaging device.

Hereinafter, solid-state imaging devices and methods for driving the same according to the embodiments of the present disclosure will be described with reference to the drawings. Note that each of the following embodiments shows one specific example of the present disclosure; the numerical values, shapes, materials, structural elements, the arrangement and connection of the structural elements, etc., shown in the following embodiments are mere examples, and are not intended to limit the present disclosure.

Embodiment 1

[1-1. Configuration of Solid-State Imaging Device]

Figure 1:
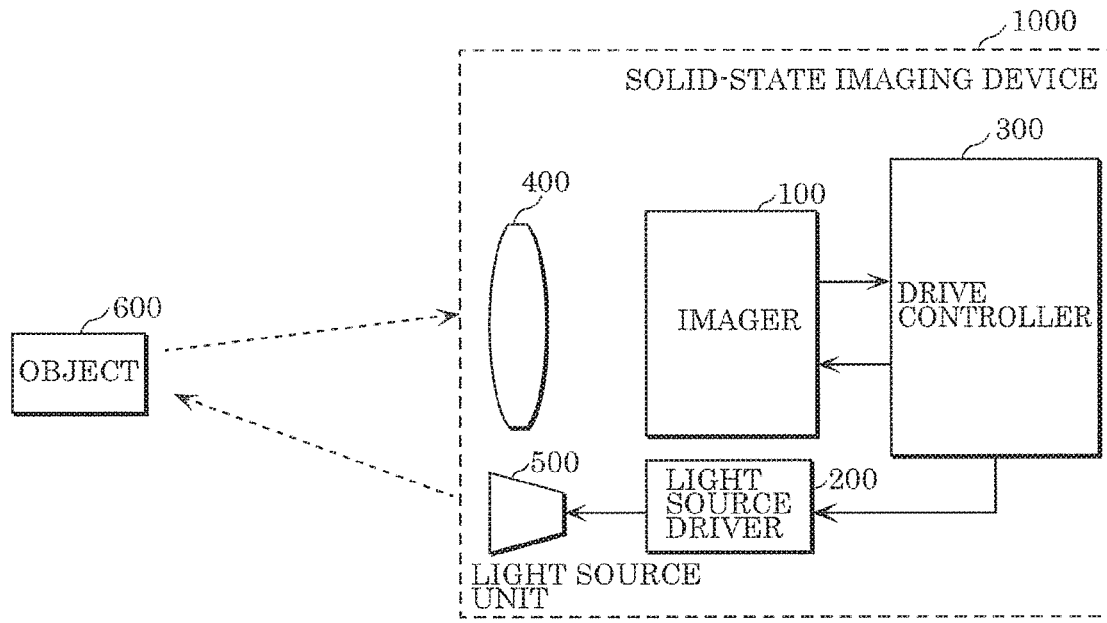
FIG. 1 is a function block diagram illustrating an example of an outline configuration of a solid-state imaging device according to Embodiment 1.

FIG. 1 is a function block diagram illustrating an example of an outline configuration of solid-state imaging device 1000 according to Embodiment 1. As illustrated in this figure, solid-state imaging device 1000 includes imager 100, light source driver 200, drive controller 300, optical lens 400, and light source unit 500.

Solid-state imaging device 1000 according to the present embodiment functions as a distance measurement imaging device which measures the distance to object 600, by emitting infrared light or the like from light source unit 500 toward object 600 and receiving, by imager 100, light reflected from object 600.

Light source driver 200 generates a light emission signal instructing light irradiation to object 600.

In accordance with the light emission signal generated by drive controller 300, light source unit 500 irradiates object 600 with light using a light emission current generated by light source driver 200.

Imager 100 includes an imaging region in which unit pixels including photoelectric conversion elements are two-dimensionally arranged, and performs exposure on a region including object 600 plural times according to timing indicated by the exposure signal generated by drive controller 300, and generates a distance measurement signal corresponding to the total amount of exposure performed plural times.

The drive controller generates an exposure signal instructing exposure to light reflected from object 600, and calculates the distance to object 600 on the basis of the distance measurement signal received from imager 100.

As illustrated in FIG. 1, light source unit 500 emits near infrared light toward object 600 under background light, for example. The light reflected from object 600 enters imager 100 through optical lens 400. The reflected light incident on imager 100 forms an image, and the formed image is converted into an electrical signal. The operations of light source unit 500 and imager 100 are controlled by drive controller 300. The output of imager 100 is converted into a distance image, and also into a visible image depending on the usage, by drive controller 300. One example of imager 100 is a solid-state imaging element such as what is called a complementary metal-oxide-semiconductor (CMOS) image sensor.

Note that the solid-state imaging device according to the present disclosure is not required to include light source unit 500 and light source driver 200 which actively emit light toward object 600 unlike solid-state imaging device 1000 according to the present embodiment. The solid-state imaging device according to the present disclosure may obtain luminance information, etc., of object 600 by receiving external irradiating light (including natural light) reflected from object 600.

[1-2. Configuration of Distance Measurement Pixel]

Figure 2:
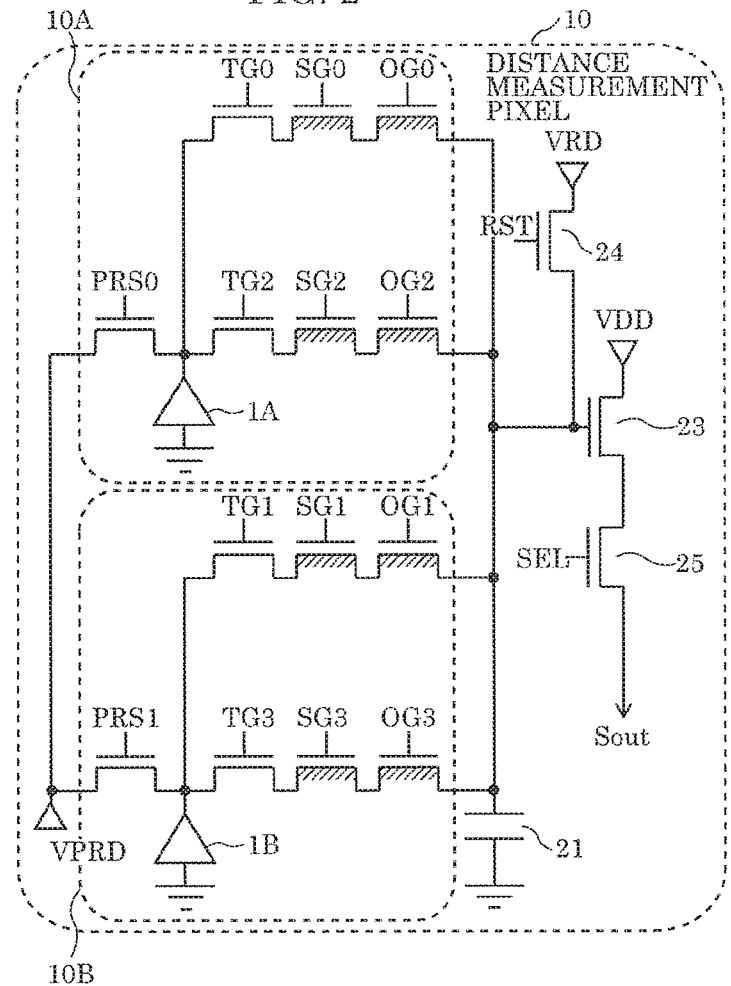
FIG. 2 illustrates a circuit configuration of a distance measurement pixel of a solid-state imaging device according to Embodiment 1.

FIG. 2 illustrates a circuit configuration of a distance measurement pixel of the solid-state imaging device according to Embodiment 1. This figure illustrates a circuit configuration of a distance measurement pixel two-dimensionally arranged in the imaging region of imager 100 according to the present embodiment. As illustrated in FIG. 2, distance measurement pixel 10 includes: two unit pixels 10A and 10B which receive reflected light, photoelectrically convert the reflected light into signal charge, and accumulate and output the signal charge; one floating diffusion layer (FD) 21 which converts the signal charge into a voltage; reset (RST) transistor 24 which discharges the signal charge of FD 21 to a reset drain (VRD); amplification transistor 23 which is connected to a VDD power supply and amplifies a signal from FD 21; and selection (SEL) transistor 25 which outputs and controls a signal from amplification transistor 23 in accordance with an exteriorly obtained selection signal.

Each of two unit pixels 10A and 10B includes: one light receiver which receives the reflected light and photoelectrically converts the received light; one charge reset transistor which discharges, to a charge discharger, a signal obtained from the light receiver; two read transistors which read the signal from the light receiver; two charge accumulation transistors which accumulate the signal read by the two read transistors; and one or two output transistors which output the signal accumulated in the charge accumulation transistors. Each of the above-mentioned transistors has a structure in which a gate insulating film and a gate electrode are formed in this order above a semiconductor substrate, and can switch between a conducting state and a non-conducting state between a source and a drain using a drive pulse signal supplied from the gate electrode. In the subsequent description, each of the transistors or the gate electrode thereof may be referred to simply as a gate.

More specifically, unit pixel 10A includes one photoelectric conversion element 1A, read gates TG0 and TG2, charge accumulation gates SG0 and SG2, output gates OG0 and OG2, and charge reset gates PRS0. Unit pixel 10B includes one photoelectric conversion element 1B, read gates TG1 and TG3, charge accumulation gates SG1 and SG3, output gates OG1 and OG3, and charge reset gates PRS1.

Note that in the configuration of the distance measurement pixel according to the present embodiment, the number of read transistors, charge accumulation transistors, and output transistors included in one unit pixel is twice as large as that in the related art. These transistors, however, can be formed within an element isolation region between the photoelectric conversion elements with the recent, finer CMOS process technology as long as the pixel size is in the range of 2 µm to 50 µm, which is typical for the TOF sensors, and thus it is possible to provide a sufficient area for the photoelectric conversion elements.

Furthermore, as a result of an increase in the number of such transistors, even if the area of the photoelectric conversion element is slightly reduced, introduction of an on-chip microlens and a waveguide path on the pixel allows the reflected light directed to the receiver to be efficiently guided to the photoelectric conversion element, as illustrated in the cross-sectional structure of the unit pixel (FIG. 3) to be described later. With this, it is possible to inhibit a reduction in pixel properties such as sensitivity degradation and saturation.

[1-3. Cross-Sectional Structure of Unit Pixel]

Figure 3:
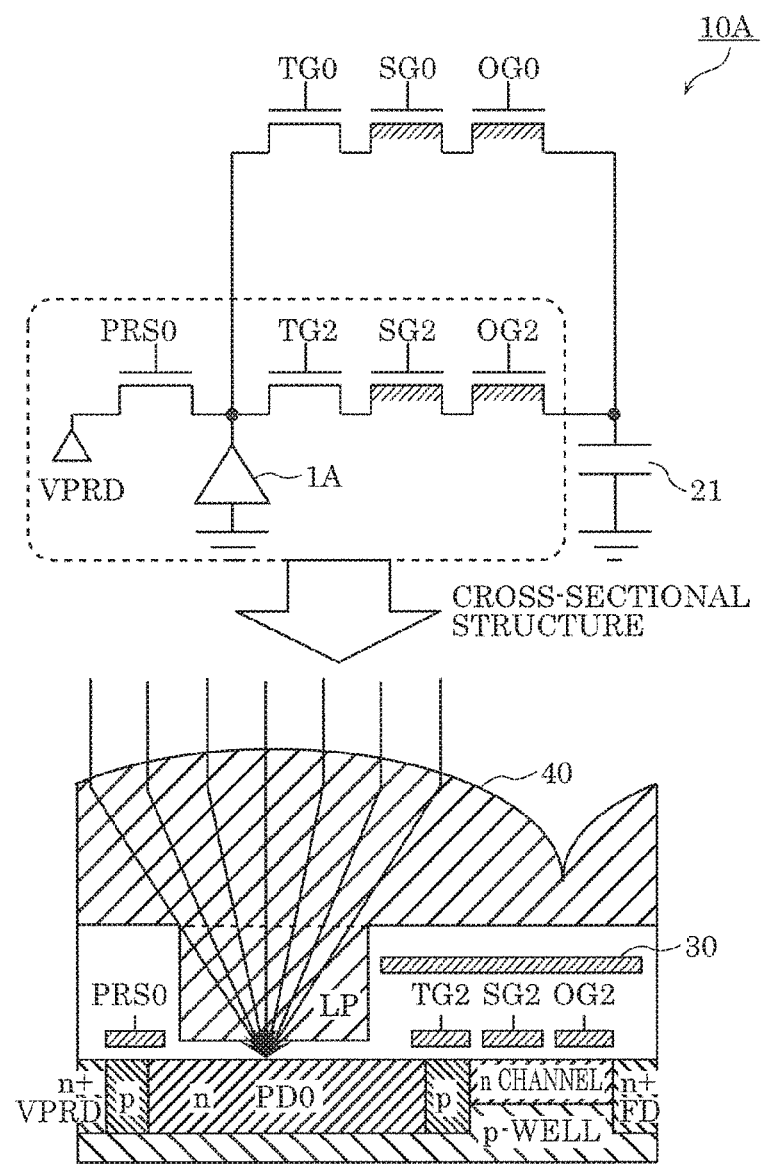
FIG. 3 illustrates a cross-sectional structure of a unit pixel according to Embodiment 1.

FIG. 3 illustrates a cross-sectional structure of the unit pixel according to Embodiment 1. Specifically, the cross-sectional structure of a charge transfer path to which read gate TG2 of unit pixel 10A belongs is depicted in FIG. 3. As illustrated in FIG. 3, photoelectric conversion element 1A (PD0) is formed in an n-type region on a p-type substrate or a p-well, and the read transistor (RG2) and the charge reset transistor (PRS0) adjacent to photoelectric conversion element 1A (PD0) are formed in a p-type region. The drain (VPRD) adjacent to the charge reset transistor (PRS0) is formed in a n+-type region. The drain (VPRD) discharges the signal charge from photoelectric conversion element 1A (PD0) via the charge reset transistor (PRS0), and thus is connected to a VH power supply.

The signal charge accumulated in the charge accumulation transistor (SG2) is transferred to FD 21 via the output transistor (OG2) on the same principle as a charge-coupled device, and thus the charge accumulation transistor (SG2) and the output transistor (OG2) adjacent to the read transistor (TG2) are formed with an n-type buried channel. Light-shielding film 30 made from a metal or a metallic compound including tungsten (W), aluminum (Al), and copper (Cu) is formed at least on the charge accumulation transistor (SG2) so as not to allow the direct entry of the reflected light, the background light, and the like at the time of signal accumulation.

Microlens 40 is formed above light-shielding film 30 via waveguide path LP, allowing the reflected light directed to unit pixel 10A to be efficiently condensed onto photoelectric conversion element 1A (PD0). Note that light-shielding film 30 may be formed above the charge reset transistor (PRS0). In the present embodiment, however, since the charge reset transistor needs to be turned ON and OFF at very high speed, light-shielding film 30 is preferably unformed, with priority placed on the property of reducing parasitic capacitance.

[1-4. Distance Measurement Drive Timing]

The drive timing for distance measurement pixels according to the present embodiment will be described with reference to FIG. 4A to FIG. 4D and FIG. 5.

Figure 4A:
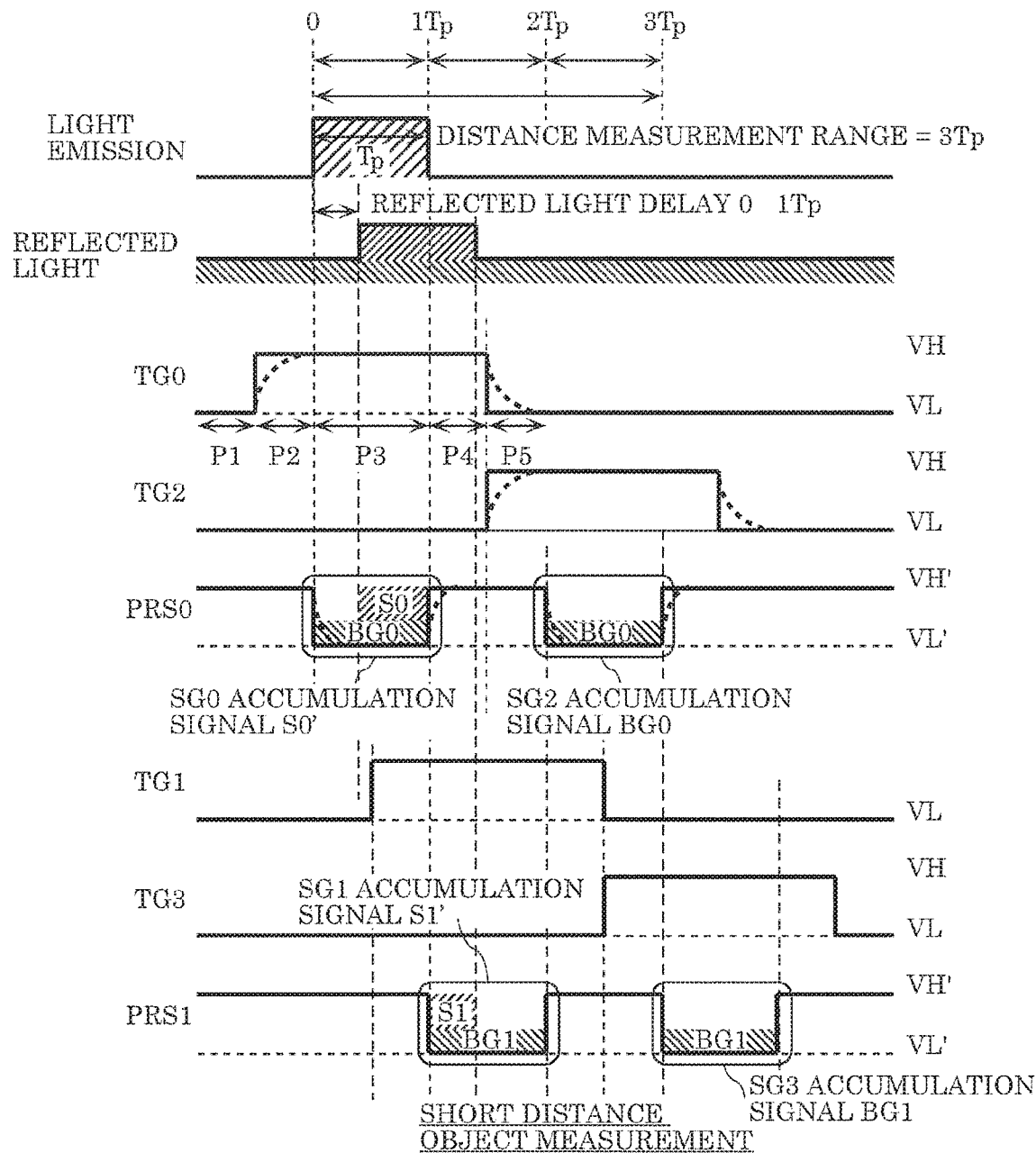
FIG. 4A is a distance measurement drive timing chart for short-distance measurement of a solid-state imaging device according to Embodiment 1.
Figure 4B:
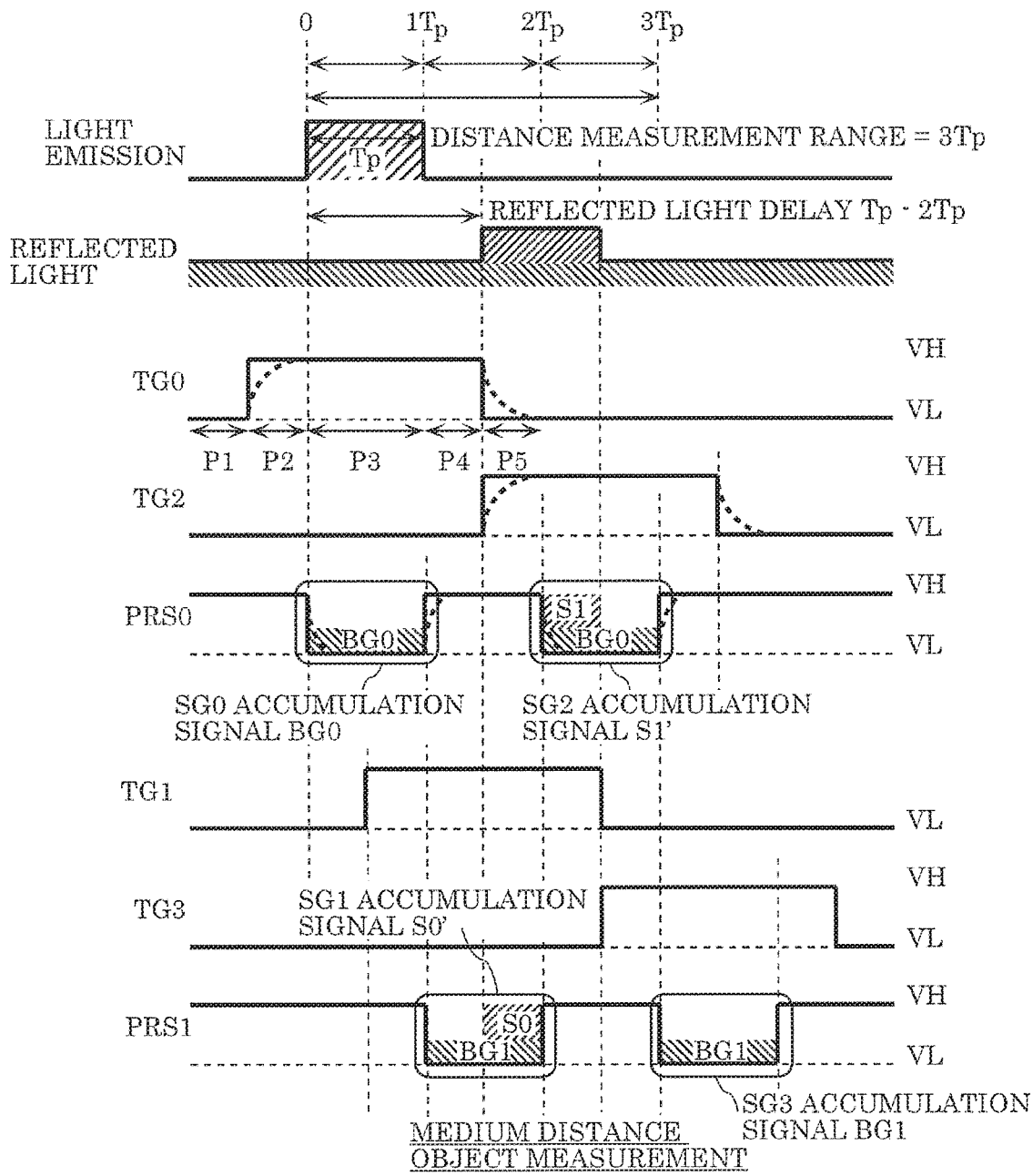
FIG. 4B is a distance measurement drive timing chart for medium-distance measurement of a solid-state imaging device according to Embodiment 1.

FIG. 4A is a distance measurement drive timing chart for short-distance object measurement of the solid-state imaging device according to Embodiment 1. FIG. 4B is a distance measurement drive timing chart for medium-distance object measurement of the solid-state imaging device according to Embodiment 1. FIG. is a distance measurement drive timing chart for long-distance object measurement of the solid-state imaging device according to Embodiment 1. FIG. 4D illustrates combinations of signals obtained by the short-distance object measurement, the medium-distance object measurement, and the long-distance object measurement. FIG. 5 illustrates transitions of a pixel potential distribution at the time of distance measurement driving of the unit pixel according to Embodiment 1.

Assuming that Tp represents the pulse width of the irradiating light, the short-distance object measurement is measurement for an object in which the delay amount of the reflected light with respect to the irradiating light is 0 to 1 Tp (short distance), the medium-distance object measurement is measurement for an object in which the delay amount of the reflected light with respect to the irradiating light is 1 Tp to 2 Tp (medium distance), and the long-distance object measurement is measurement for an object in which the delay amount of the reflected light with respect to the irradiating light is 2 Tp to 3 Tp (long distance).

Figure 4C:
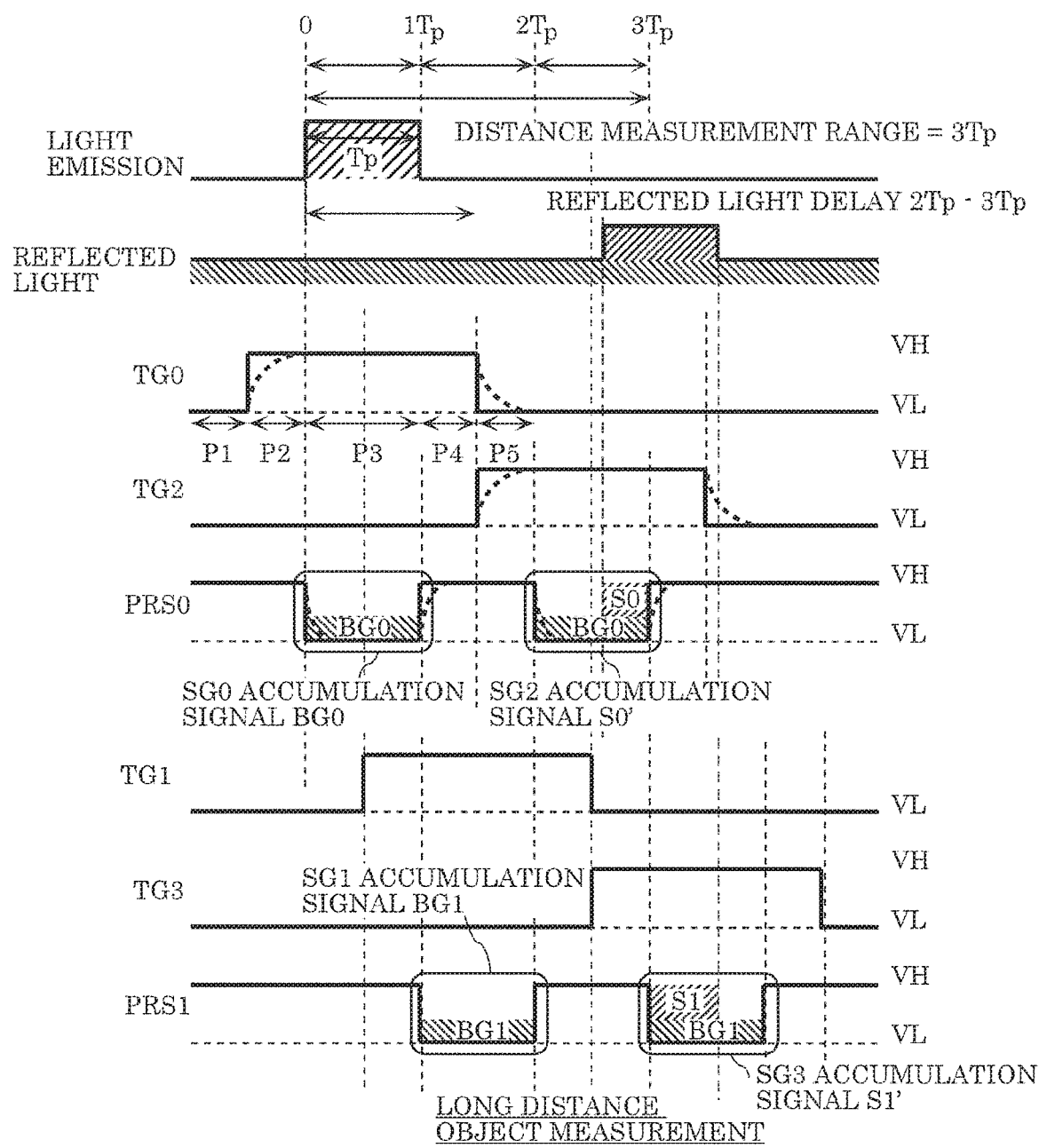
FIG. 4C is a distance measurement drive timing chart for long-distance measurement of a solid-state imaging device according to Embodiment 1.
Figures 4D, 5:
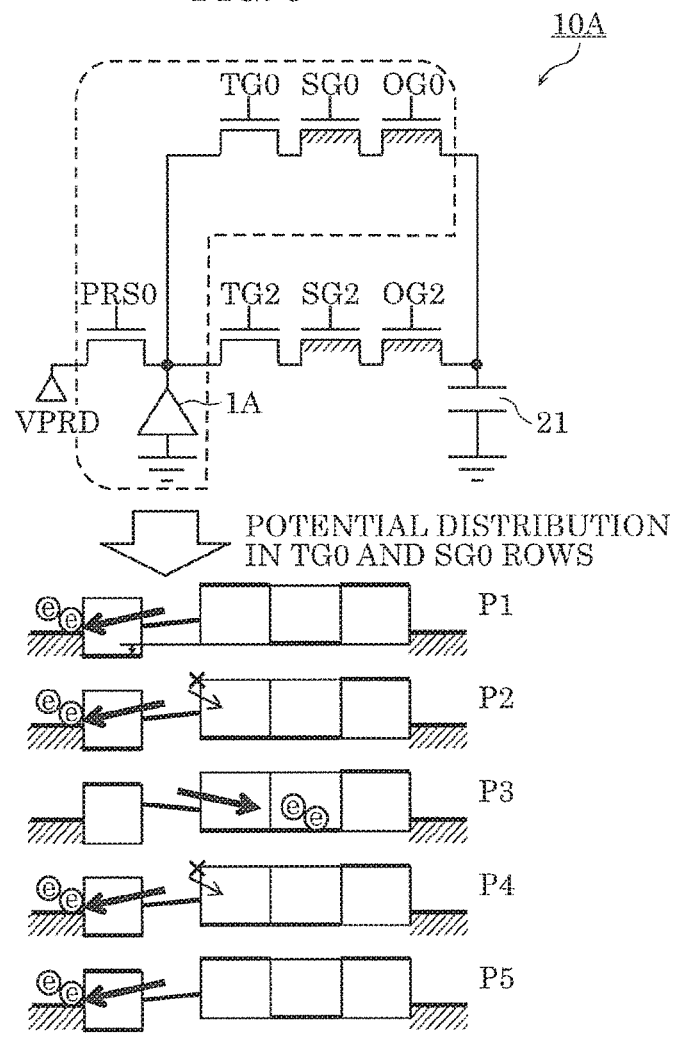
FIG. 4D illustrates combinations of signals obtained by short-distance measurement, medium-distance measurement, and long-distance measurement.
FIG. 5 illustrates transitions of a pixel potential distribution at the time of distance measurement driving of a unit pixel according to Embodiment 1.

As illustrated in FIG. 4A to FIG. 4C, first, in period P1, drive controller 300 switches OFF read gate TG0 of unit pixel 10A and switches ON exposure reset gate PRS0 of unit pixel 10A. Thus, the signal charge of photoelectric conversion element 1A is discharged to drain VPRD (P1 in FIG. 5).

Next, in period P2, drive controller 300 switches ON read gate TG0 (VL to VH) (P3 in FIG. 5).

Next, in period P3, drive controller 300 causes exposure reset gate PRS0 to transition to OFF (VH to VL) in synchronization with the start of emission of an irradiating pulsed beam. With this, the first exposure of photoelectric conversion element 1A is started (P3 in FIG. 5).

Next, in period P4, drive controller 300 causes exposure reset gate PRS0 to transition to ON (VL to VH) in synchronization with the end of the emission of the irradiating pulsed beam. With this, the first exposure of photoelectric conversion element 1A is completed (P4 in FIG. 5).

Next, in period P5, drive controller 300 causes read gate TG0 to transition to OFF (VH to VL) (P5 in FIG. 5).

Thus, the first exposure sequence is completed. In other words, the first exposure sequence corresponds to the first exposure operation of photoelectric conversion element 1A of unit pixel 10A in periods P1 to P5.

Next, in the state where read gate TG1 of unit pixel 10B is ON (VL to VH) and a new irradiating pulsed beams is not emitted, drive controller 300 causes exposure reset gate PRS1 to transition to OFF (VH to VL) in synchronization with the end of the emission of the irradiating pulsed beam in period P3 mentioned above. With this, the first exposure of photoelectric conversion element 1B is started.

Next, drive controller 300 causes exposure reset gate PRS1 to transition to ON (VL to VH) at a point in time when period Tp (a first predetermined period of time) has elapsed since exposure reset gate PRS1 is switched OFF. With this, the first exposure of photoelectric conversion element 1B is completed.

Next, drive controller 300 causes read gate TG1 to transition to OFF (VH to VL).

Thus, the second exposure sequence is completed. In other words, the second exposure sequence corresponds to the first exposure operation of photoelectric conversion element 1B of unit pixel 10B.

Next, in the state where read gate TG2 of unit pixel 10A is ON (VL to VH), drive controller 300 causes exposure reset gate PRS0 to transition to OFF (VH to VL). With this, the second exposure of photoelectric conversion element 1A is started.

Next, drive controller 300 causes exposure reset gate PRS0 to transition to ON (VL to VH) at a point in time when period Tp (the first predetermined period of time) has elapsed since exposure reset gate PRS0 is switched OFF. With this, the second exposure of photoelectric conversion element 1A is completed.

Next, drive controller 300 causes read gate TG2 to transition to OFF (VH to VL).

Thus, the third exposure sequence is completed. In other words, the third exposure sequence corresponds to the second exposure operation of photoelectric conversion element 1A of unit pixel 10A.

Next, in the state where read gate TG3 of unit pixel 10B is ON (VL to VH), drive controller 300 causes exposure reset gate PRS1 to transition to OFF (VH to VL). With this, the second exposure of photoelectric conversion element 1B is started.

Next, drive controller 300 causes exposure reset gate PRS1 to transition to ON (VL to VH) at a point in time when period Tp (the first predetermined period of time) has elapsed since exposure reset gate PRS1 is switched OFF. With this, the second exposure of photoelectric conversion element 1B is completed.

Next, drive controller 300 causes read gate TG3 to transition to OFF (VH to VL).

Thus, the fourth exposure sequence is completed. In other words, the fourth exposure sequence corresponds to the second exposure operation of photoelectric conversion element 1B of unit pixel 10B.

In this way, drive controller 300 obtains a signal necessary for distance measurement by performing the first exposure sequence to the fourth exposure sequence.

FIG. 4D illustrates the correlation between the signals accumulated in the charge accumulation transistors (SG0, SG1, SG2, and SG3) and the distance measurement ranges. For example, in the short-distance (0 to 1 Tp) measurement, reflected-light signal S0' is accumulated in the charge accumulation transistor (SG0), reflected-light signal S1' is accumulated in the charge accumulation transistor (SG1), background-light signal BG0 is accumulated in the charge accumulation transistor (SG2), and background-light signal BG1 is accumulated in the charge accumulation transistor (SG3).

The signal amount of S0' and S1' (the reflected-light signals) is greater than that of BG0 and BG1 (the background-light signals), and thus, by determining a combination of two charge accumulation transistors (SG) having a great amount of signals, it is possible to use different distance measurement calculation expressions for short, medium, and long distances with reference to the table illustrated in FIG. 4D, which enables seamless distance measurement covering a wide range from a short distance to a long distance.

Distance measurement calculation expressions for obtaining distance L to object 600 at short, medium, and long distances are shown below.

(1) When the reflected-light delay is 0 to 1 Tp, distance L is given by Equation 5 and Equation 6 below.

[Math. 2]

$$S0' = S0 + BG0 \quad \text{(Equation 5)}$$
$$S1' = S1 + BG1$$

$$L = \frac{c \cdot Tp}{2}\left(\frac{S1}{S0 + S1}\right) \quad \text{(Equation 6)}$$

(2) When the reflected-light delay is 1 Tp to 2 Tp, distance L is given by Equation 7 and Equation 8 below.

[Math. 3]

$$S0' = S0 + BG1 \quad \text{(Equation 7)}$$
$$S1' = S1 + BG0$$

$$L = \frac{c \cdot Tp}{2}\left(1 + \frac{S1}{S0 + S1}\right) \quad \text{(Equation 8)}$$

(3) When the reflected-light delay is 2 Tp to 3 Tp, distance L is given by Equation 9 and Equation 10 below.

[Math. 4]

$$S0' = S0 + BG0 \quad \text{(Equation 9)}$$
$$S1' = S1 + BG1$$

$$L = \frac{c \cdot Tp}{2}\left(2 + \frac{S1}{S0 + S1}\right) \quad \text{(Equation 10)}$$

Here, the potential change of the unit pixel at the time of exposure will be described with reference to FIG. 5.

In period P1, read gate TG0 and exposure reset gate PRS0 are set to VH, and all the signal charge resulting from photoelectrical conversion by photoelectric conversion element 1A is discharged to the drain (VPRD) via exposure reset gate PRS0. Next, read gate TG0 is switched ON (VH) first, and after a lapse of a certain period P2, exposure reset gate PRS0 is switched OFF (VL).

In period P2, both read gate TG0 and exposure reset gate PRS0 are ON (VH), but the potential of exposure reset gate PRS0 is set higher than the potential of read gate TG0. Thus, most of the signal charge resulting from photoelectrical conversion by photoelectric conversion element 1A flows toward exposure reset gate PRS0 in the fringing field and is discharged to the drain (VPRD). Note that in order to set the potential of exposure reset gate PRS0 higher than the potential of read gate TG0, for example, the threshold voltage of exposure reset gate PRS0 is set lower than the threshold voltage of read gate TG0. Examples of this approach include setting the p-type impurity concentration of exposure reset gate PRS0 lower than the p-type impurity concentration of read gate TG0. Alternatively, a direct-current (DC) voltage of approximately 0 to (VH−VL)/2 may be superimposed on exposure reset gate PRS0. Examples of this approach include setting high-level potential VH' of exposure reset gate PRS0 higher than potential VH of read gate TG0.

In period P3, read gate TG0 is ON and exposure reset gate PRS0 is OFF, and all the signal charge resulting from photoelectrical conversion by photoelectric conversion element 1A is transferred, via read gate TG0, to the charge accumulation transistor (SG0), and accumulated therein; thus, the exposure in the 0 to 1 Tp period is performed.

Next, exposure reset gate PRS0 is switched ON, and after a lapse of a certain period P4, read gate TG0 is switched OFF; thus, the first exposure sequence is completed. Note that the state of potential in period P4 is the same as the state of potential in period P2, and the state of potential in period P5 is the same as the state of potential in period P1; the same or similar operations are performed.

Although the charge transfer path through read gate TG0 and exposure reset gate PRS0 of unit pixel 10A mentioned above has been described, the same or similar potential change occurs in the charge transfer path through read gate TG1 and exposure reset gate PRS1, the charge transfer path through read gate TG2 and exposure reset gate PRS0, and the charge transfer path through read gate TG3 and exposure reset gate PRS1.

[1-5. Advantageous Effects of Embodiment 1]

(1) Unlike the conventional technique adopting three accumulations with three unit pixels, the drive method according to the present embodiment adopts two accumulations with one unit pixel, allowing four signals necessary for distance measurement to be obtained by two unit pixels.

Figure 6A:
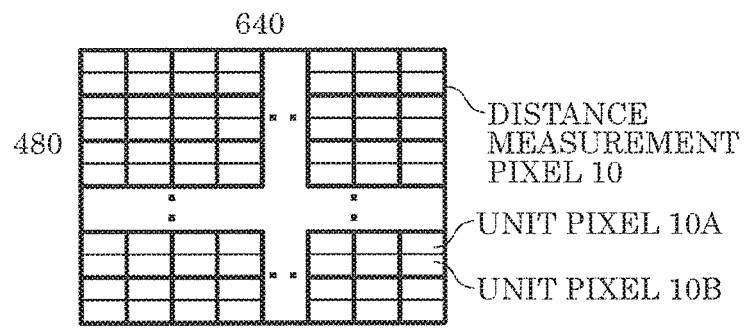
FIG. 6A illustrates that a solid-state imaging device according to Embodiment 1 can reduce an optical size.
Figure 6B:
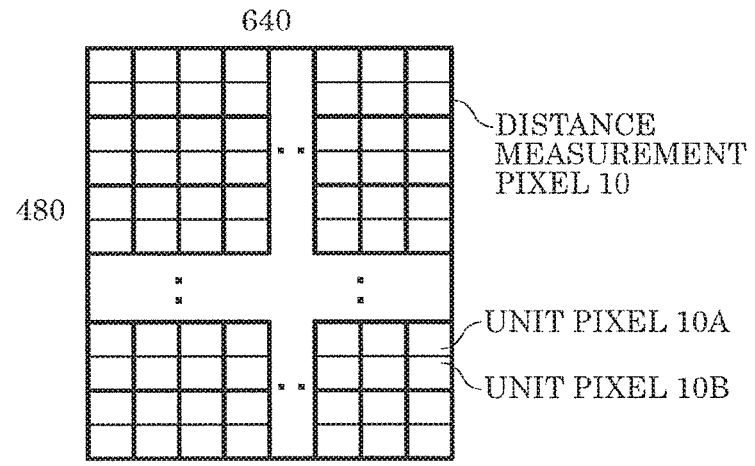
FIG. 6B illustrates that a solid-state imaging device according to Embodiment 1 can enlarge a unit pixel size.

FIG. 6A illustrates that the solid-state imaging device according to Embodiment 1 can reduce the optical size, and FIG. 6B illustrates that the solid-state imaging device according to Embodiment 1 can enlarge a unit pixel size. As illustrated in FIG. 6A, compared to the related art, when the unit pixel size is made the same, the distance measurement pixel size can be reduced, and thus the optical size can be reduced. Alternatively, as illustrated in FIG. 6B, compared to the related art, when the optical size is set equivalent, the number of unit pixels included in one distance measurement pixel can be reduced, and thus the unit pixel size can be doubled, allowing significant improvements to pixel properties such as sensitivity and saturation.

(2) When S0 and S1 are respectively derived by subtracting the BG component from S0' and S1', S0 is obtained by subtracting BG0 from S0' (=S0+BG0) of the same unit pixel 10A, and S1 is obtained by subtracting BG1 from S1' (=S1+BG1) of the same unit pixel 10B. Therefore, variations in the sensitivity of the photoelectric conversion elements, the dark current that flows through the photoelectric conversion elements, and the exposure that are caused by the physical difference between the unit pixels (the physical difference due to the production tolerance of unit pixel 10A and unit pixel 10B) are cancelled out, and thus distance measurement variations are reduced.

(3) The drive method according to the present embodiment allows four signals to be obtained by four accumulations with two unit pixels, and allows distinction between short, medium, and long distances by determining the magnitude relationship between S0', S1', BG0, and BG1 signals. Thus, the distance measurement range can be widened up to 3 Tp (when Tp=11 ns, distance measurement range Zmax is 4.95 m).

(4) The exposure period is determined by switching ON and OFF exposure reset gate PRS in such a manner that exposure reset gate PRS is switched OFF after a lapse of a certain period since read gate TG is switched ON, and read gate TG is switched OFF after a lapse of a certain period since exposure reset gate PRS is switched ON. With this, the exposure time is not affected by variations in the timing for switching ON and OFF read gate TG, and thus improvement can be made to the distance measurement variations, offset, and shading.

[1-6. Distance Measurement Drive Timing According to Variation]

In Embodiment 1, the case is assumed in which light is repeatedly emitted in such a manner that the interval between the start of emission of an irradiating pulsed beam and the next start of the light emission is longer than 4 Tp. In contrast, the present variation describes a drive method in which the interval between the start of emission of an irradiating pulsed beam and the next start of the light emission is set to 4 Tp, and the light emission and the exposure are repeatedly performed on a 4-Tp cycle.

Figure 7A:
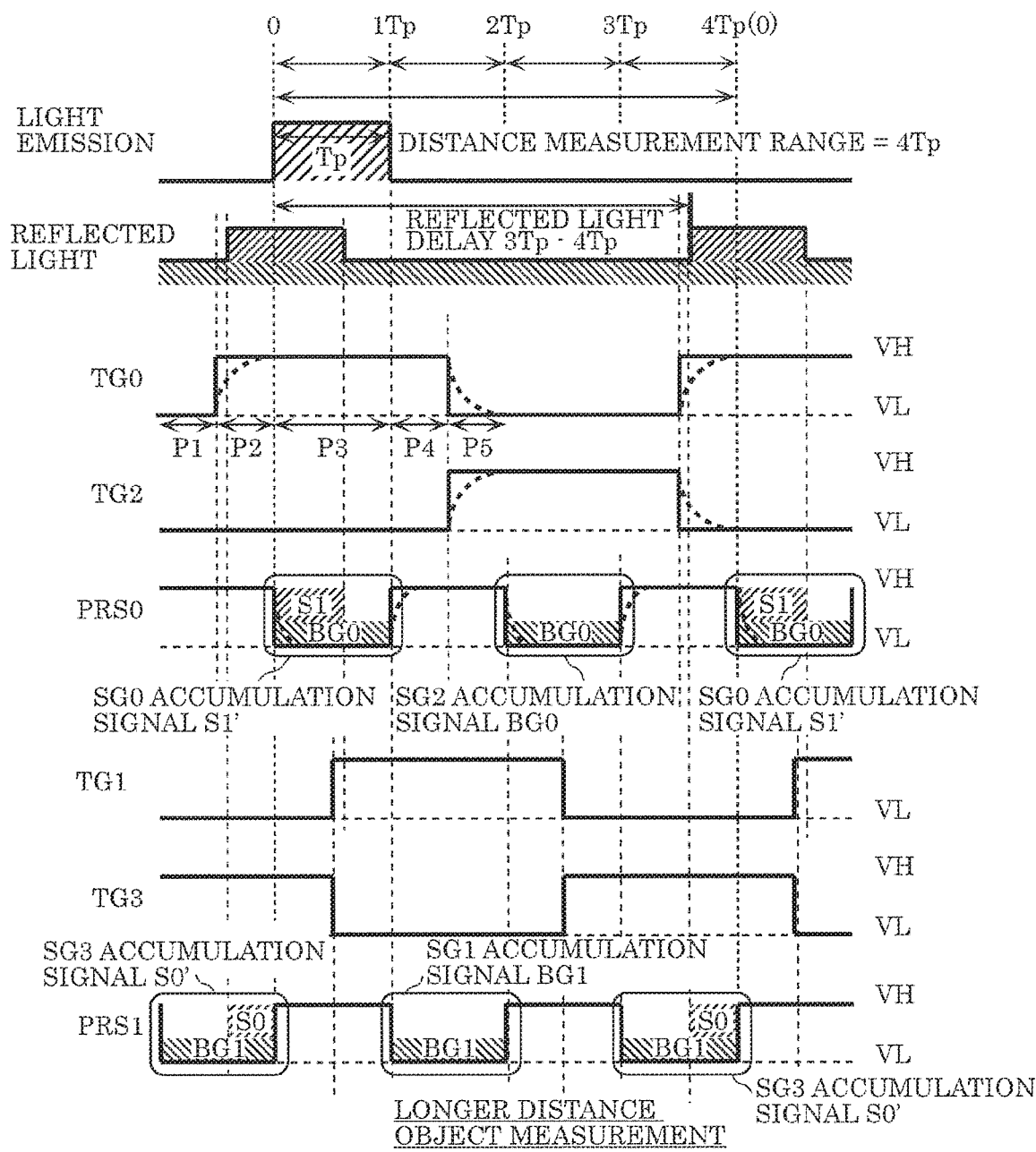
FIG. 7A is a distance measurement drive timing chart for longer-distance measurement of a solid-state imaging device according to a variation of Embodiment 1.
Figures 7B, 8:
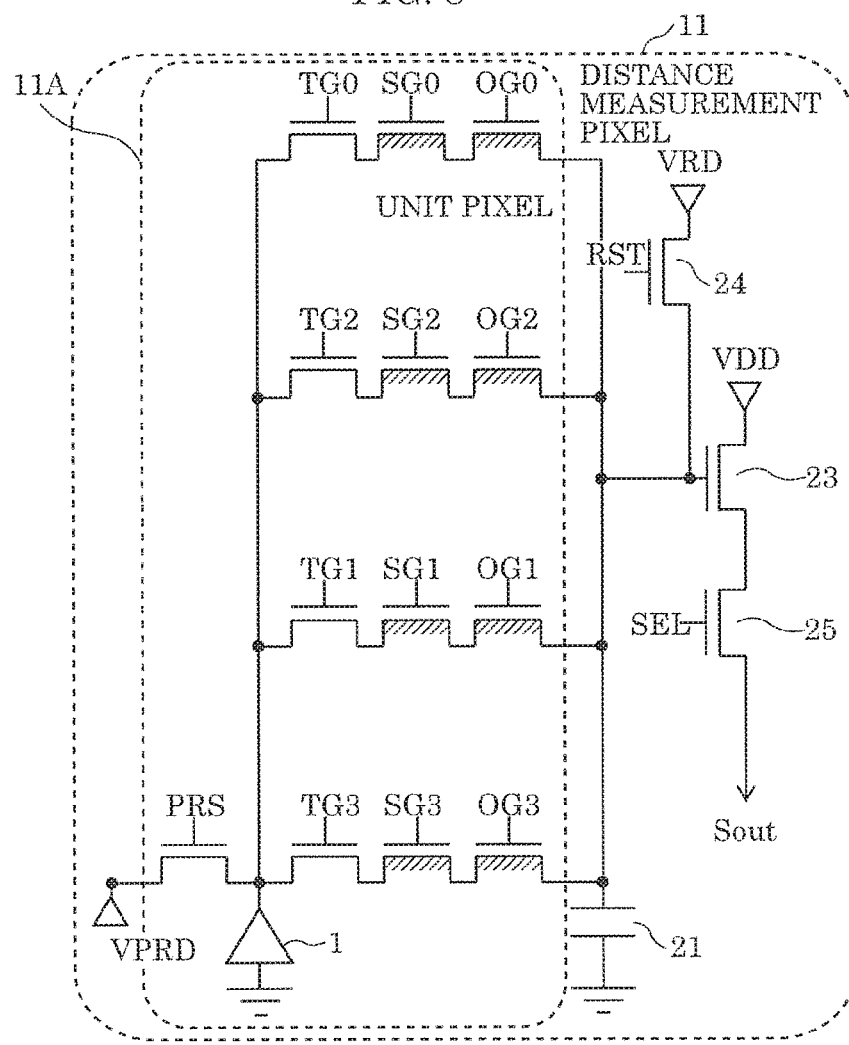
FIG. 7B additionally illustrates a combination of signals obtained by longer-distance measurement.
FIG. 8 illustrates a circuit configuration of a distance measurement pixel of a solid-state imaging device according to Embodiment 2.

FIG. 7A is a distance measurement drive timing chart for longer-distance object measurement of a solid-state imaging device according to a variation of Embodiment 1. FIG. 7B additionally illustrates a combination of signals obtained by the longer-distance object measurement. FIG. 7A illustrates the case of an object in which delay time of the reflected light is 3 Tp to 4 Tp (longer distance), and the distance measurement calculation table applied at this time is as illustrated in the table in FIG. 7B.

As illustrated in FIG. 7A, when signals in the charge accumulation transistor (SG0) and the charge accumulation transistor (SG3) are greater than signals in the charge accumulation transistor (SG1) and the charge accumulation transistor (SG2), it can be determined that the delay amount of the reflected light is between 3 Tp and 4 Tp. Furthermore, at this time, distance L to object 600 can be calculated according to Equations 11 and 12 below. Note that the determination of short, medium, and long distances according to the magnitude of signals in the charge accumulation transistors (SG0 to SG3) and the distance measurement calculation expressions are the same as or similar to those indicated in Equation 5 to Equation 10.

(1) When the delay of the reflected light is between 3 Tp and 4 Tp:

[Math. 5]

$$S0 = S0' - BG1 \qquad \text{(Equation 11)}$$
$$S1 = S1' - BG0$$

$$L = \frac{c \cdot Tp}{2}\left(3 + \frac{S1}{S0 + S1}\right) \qquad \text{(Equation 12)}$$

[1-7. Advantageous Effects of Variation]

Since the exposure of the charge accumulation transistor (SG0) is started in synchronization with the end of the exposure of the charge accumulation transistor (SG3), the charge accumulation transistor (SG3) and the charge accumulation transistor (SG0) can obtain S0' and S1' even if the delay amount of the reflected light is between 3 Tp and 4 Tp. As a result, the distance measurement range can be widened up to 4 Tp (when Tp=11 ns, distance measurement range Zmax is 6.6 m).

Embodiment 2

[2-1. Configuration of Distance Measurement Pixel]

FIG. 8 illustrates a circuit configuration of a distance measurement pixel of a solid-state imaging device according to Embodiment 2. As illustrated in FIG. 8, distance measurement pixel 11 includes: one unit pixel 11A which receives reflected light, photoelectrically converts the reflected light into signal charge, and accumulates and outputs the signal charge; one FD 21 which converts the signal charge into a voltage; reset (RST) transistor 24 which discharges the signal charge of FD 21 to a reset drain (VRD); amplification transistor 23 which is connected to a VDD power supply and amplifies a signal from FD 21; and selection (SEL) transistor 25 which outputs and controls a signal from amplification transistor 23 in accordance with an exteriorly obtained selection signal.

One unit pixel 11A includes: one light receiver which receives the reflected light and photoelectrically converts the received light; one charge reset transistor which discharges, to a charge discharger, a signal obtained from the light receiver; four read transistors which read the signal from the light receiver; four charge accumulation transistors which accumulate the signal read by the four read transistors; and one, two, or four output transistors which output the signal accumulated in the charge accumulation transistors (FIG. 8 illustrates the case where four output transistors are provided).

More specifically, unit pixel 11A includes one photoelectric conversion element 1, read gates TG0, TG2, TG1, and TG3, charge accumulation gates SG0, SG2, SG1, and SG3, output gates OG0, OG2, OG1, and OG3, and charge reset gate PRS.

[2-2. Advantageous Effects Based on Configuration of Distance Measurement Pixel]

Compared to distance measurement pixel 10 according to Embodiment 1, in distance measurement pixel 11 according to Embodiment 2, the number of read gates TG and the number of charge accumulation gates SG are unchanged, but the number of photoelectric conversion elements and the number of charge reset gates PRS are each reduced from two to one. Therefore, the area of the photoelectric conversion element can be approximately doubled, and the sensitivity per photoelectric conversion element is increased about twofold.

In order to determine the distance measurement exposure time, charge reset gate PRS needs to be switched ON and OFF at a pulse width of several ns to several hundred ns. Especially, when a short pulse width is required to improve the distance measurement accuracy, the rising edge time and the falling edge time need be no greater than several ns.

A typical solution to this issue is to increase the width of a metal wire or provide multiple wires so that the resistance is reduced, but this causes problems such as a smaller aperture of the photoelectric conversion element and a reduction in sensitivity.

In contrast, with the configuration of distance measurement pixel 11 according to the present embodiment, it is sufficient that one charge reset gate PRS be formed, and thus the photoelectric conversion element can be formed with a wide aperture, compared to that in Embodiment 1. Thus, the sensitivity per photoelectric conversion element can be increased twofold or more.

[2-3. Distance Measurement Drive Timing]

The drive timing for distance measurement pixels according to the present embodiment will be described with reference to FIG. 9A to FIG. 9D and FIG. 10.

Figure 9A:
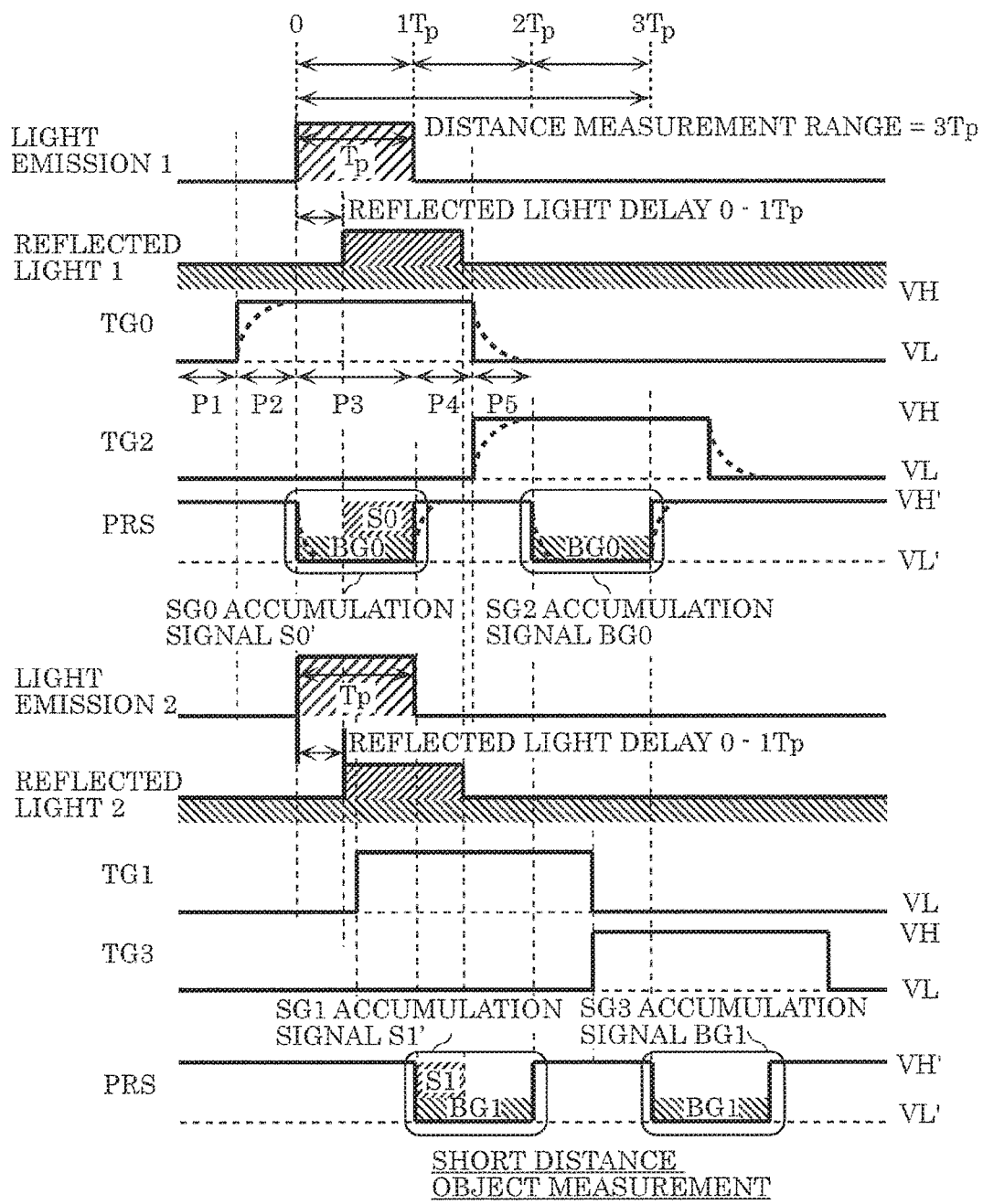
FIG. 9A is a distance measurement drive timing chart for short-distance measurement of a solid-state imaging device according to Embodiment 2.
Figure 9B:
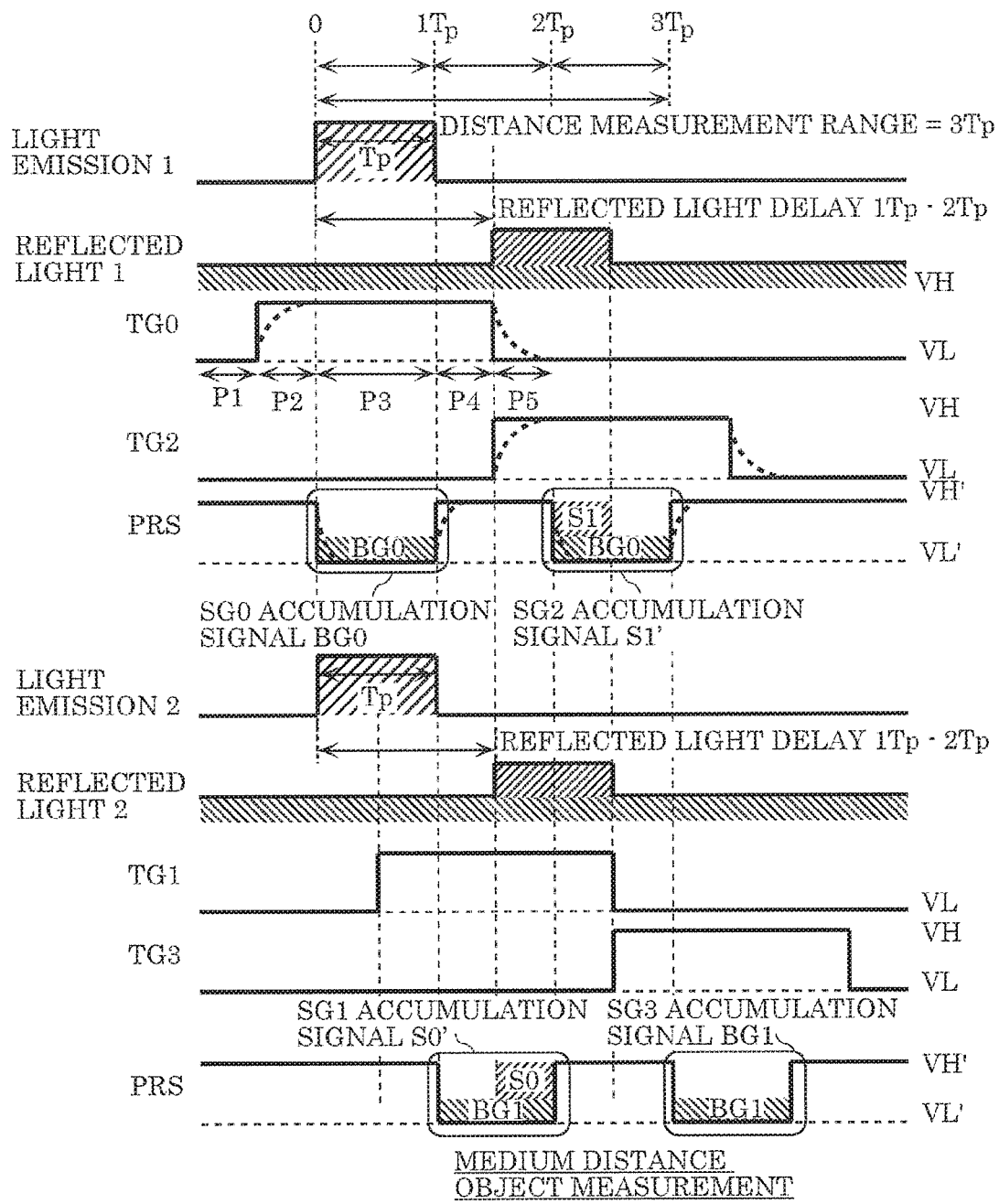
FIG. 9B is a distance measurement drive timing chart for medium-distance measurement of a solid-state imaging device according to Embodiment 2.
Figure 9C:
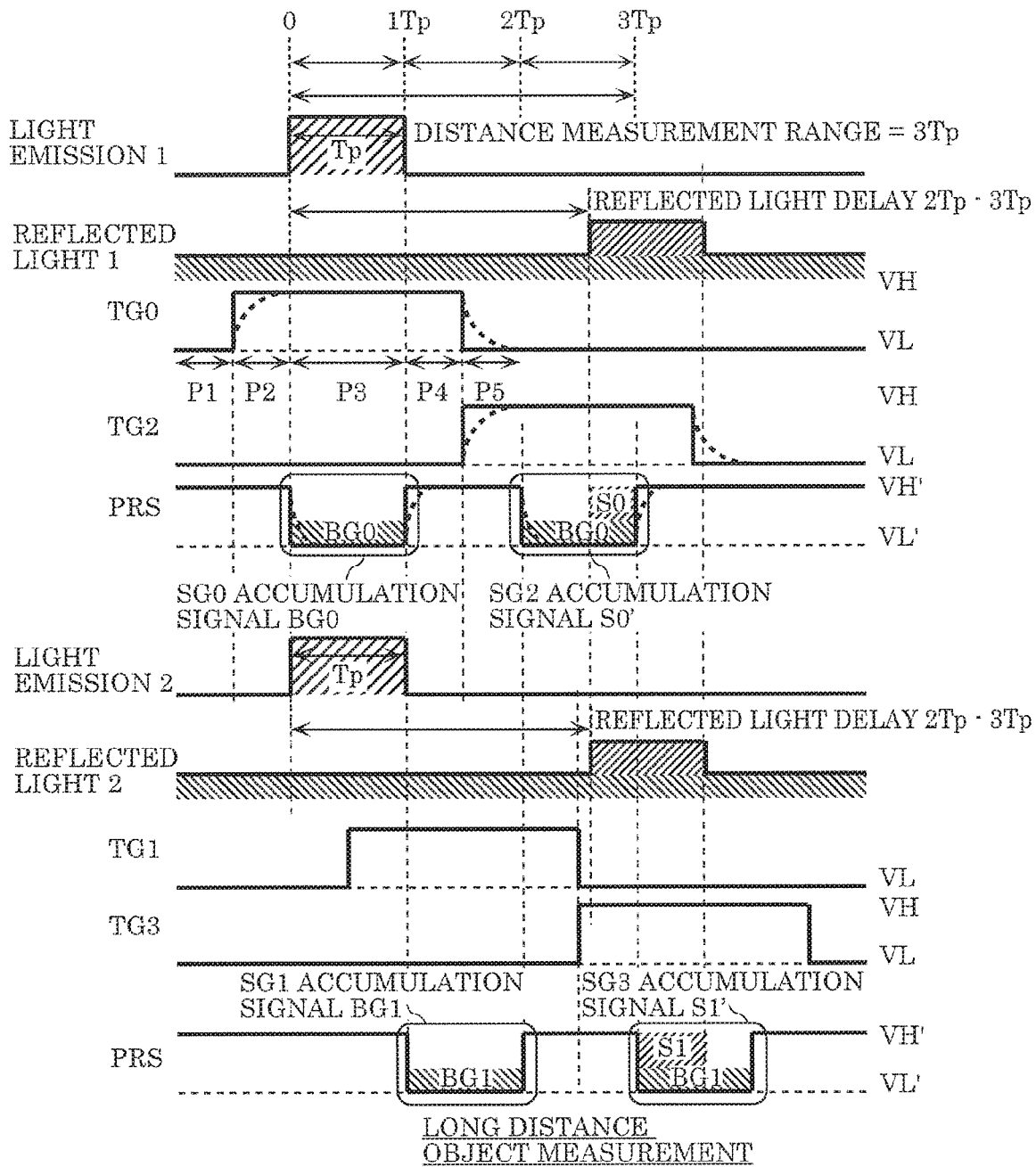
FIG. 9C is a distance measurement drive timing chart for long-distance measurement of a solid-state imaging device according to Embodiment 2.
Figure 10:
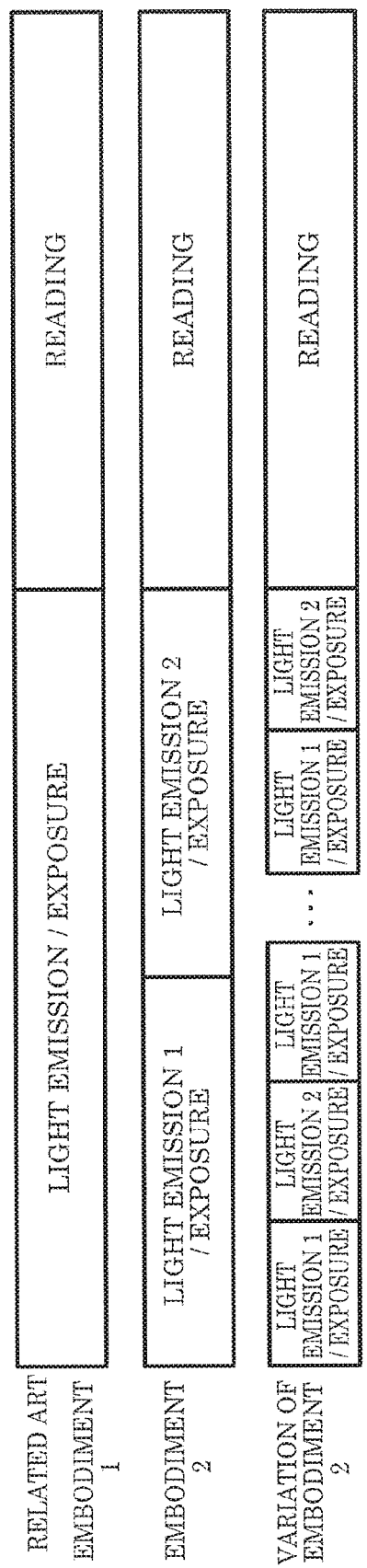
FIG. 10 illustrates comparison between sequences of light emission, exposure, and reading in distance measurement driving.

FIG. 9A is a distance measurement drive timing chart for short-distance object measurement of the solid-state imaging device according to Embodiment 2. FIG. 9B is a distance measurement drive timing chart for medium-distance object measurement of the solid-state imaging device according to Embodiment 2. FIG. 9C is a distance measurement drive timing chart for long-distance object measurement of the solid-state imaging device according to Embodiment 2. FIG. 9D illustrates combinations of signals obtained by the short-distance object measurement, the medium-distance object measurement, and the long-distance object measurement. FIG. 10 illustrates comparison between sequences of light emission, exposure, and reading in distance measurement driving.

As illustrated in FIG. 9A to FIG. 9C, first, in period P1, drive controller 300 switches OFF read gate TG0 of unit pixel 11A and switches ON exposure reset gate PRS0 of unit pixel 11A. Thus, the signal charge of photoelectric conversion element 1 is discharged to drain VPRD.

Next, in period P2, drive controller 300 switches ON read gate TG0 (VL to VH).

Next, in period P3, drive controller 300 causes exposure reset gate PRS to transition to OFF (VH to VL) in synchronization with the start of emission of the first irradiating pulsed beam (light emission 1). With this, the first exposure of photoelectric conversion element 1 is started.

Next, in period P4, drive controller 300 causes exposure reset gate PRS to transition to ON (VL to VH) in synchronization with the end of the emission of the first irradiating pulsed beam (light emission 1). With this, the first exposure of photoelectric conversion element 1 is completed.

Next, in period P5, drive controller 300 causes read gate TG0 to transition to OFF (VH to VL).

Thus, the first exposure sequence is completed. In other words, the first exposure sequence corresponds to the first exposure operation of photoelectric conversion element 1 of unit pixel 11A in periods P1 to P5.

Next, in the state where read gate TG2 of unit pixel 11A is ON (VL to VH) and a new irradiating pulsed beam is not emitted, drive controller 300 causes exposure reset gate PRS to transition to OFF (VH to VL) at a point in time when period Tp has elapsed since exposure reset gate PRS is switched ON in the first exposure sequence. With this, the second exposure of photoelectric conversion element 1 is started.

Next, drive controller 300 causes exposure reset gate PRS to transition to ON (VL to VH) at a point in time when period Tp (the second predetermined period of time) has elapsed since exposure reset gate PRS is switched OFF. With this, the second exposure of photoelectric conversion element 1 is completed.

Next, drive controller 300 causes read gate TG2 to transition to OFF (VH to VL).

Thus, the third exposure sequence is completed. In other words, the third exposure sequence corresponds to the second exposure operation of photoelectric conversion element 1 of unit pixel 11A.

Next, in the state where read gate TG1 of unit pixel 11A is ON (VL to VH), drive controller 300 causes exposure reset gate PRS to transition to OFF (VH to VL) in synchronization with the end of emission of the second irradiating pulsed beam (light emission 2). With this, the third exposure of photoelectric conversion element 1 is started.

Next, drive controller 300 causes exposure reset gate PRS to transition to ON (VL to VH) at a point in time when period Tp (the third predetermined period of time) has elapsed since exposure reset gate PRS is switched OFF. With this, the third exposure of photoelectric conversion element 1 is completed.

Next, drive controller 300 causes read gate TG1 to transition to OFF (VH to VL).

Thus, the second exposure sequence is completed. In other words, the second exposure sequence corresponds to the third exposure operation of photoelectric conversion element 1 of unit pixel 11A.

Next, in the state where read gate TG3 of unit pixel 11A is ON (VL to VH) and a new irradiating pulsed beam is not emitted, drive controller 300 causes exposure reset gate PRS to transition to OFF (VH to VL) at a point in time when period Tp has elapsed since exposure reset gate PRS is switched ON in the second exposure sequence. With this, the fourth exposure of photoelectric conversion element 1 is started.

Next, drive controller 300 causes exposure reset gate PRS to transition to ON (VL to VH) at a point in time when period Tp (the third predetermined period of time) has elapsed since exposure reset gate PRS is switched OFF. With this, the fourth exposure of photoelectric conversion element 1 is completed.

Next, drive controller 300 causes read gate TG3 to transition to OFF (VH to VL).

Thus, the fourth exposure sequence is completed. In other words, the fourth exposure sequence corresponds to the fourth exposure operation of photoelectric conversion element 1 of unit pixel 11A.

As described above, the first exposure sequence, the third exposure sequence, the second exposure sequence, and the fourth exposure sequence are sequentially performed, and thus drive controller 300 obtains a signal necessary for distance measurement.

As illustrated in the comparison between sequences of light emission, exposure, and reading in FIG. 10, in the distance measurement drive method according to Embodiment 2, it is necessary to emit light at least twice, compared to the related art and the distance measurement drive methods according to Embodiment 1.

However, as described in the advantageous effects based on the configuration of the distance measurement pixel (2-2), the sensitivity per photoelectric conversion element is increased to a value greater than or equal to twice that in Embodiment 1, and therefore the length of emission of the first irradiating pulsed beam (light emission 1) and the length of emission of the second irradiating pulsed beam (light emission 2) can each be reduced to half or less. Thus, the total length of light emission can be kept to less than or equal to the total length of light emission in the related art and Embodiment 1.

Note that the second irradiating pulsed beam (light emission 2) preferably has the same pulse width as the first irradiating pulsed beam (light emission 2).

Note that regarding the light emission sequence in Embodiment 2, first, the first irradiating pulsed beam (light emission 1) is repeated several hundred to several million times, and then the second irradiating pulsed beam (light emission 2) is repeated the same number of times before the transition to reading.

Alternatively, as illustrated at the bottom of FIG. 10, light emission 1 and light emission 2 which are repeated a small number of times may be alternately performed plural times before the transition to reading (Variation of Embodiment 2). In this case, upon the measurement of the distance to a swiftly moving object, the temporal difference between the exposure in light emission 1 and the exposure in light emission 2 can be smaller than that in Embodiment 2. As a result, distance measurement error on an edge portion of the object due to this temporal difference can be inhibited.

Note that the combinations of signals illustrated in FIG. 9D are the same as the combinations of signals illustrated in FIG. 4D according to Embodiment 1.

The distance measurement calculation expressions for determining distance L to object 600 at short, medium, and long distances according to the present embodiment and the variation thereof are the same as those in Equations 5 to 10 indicated in Embodiment 1.

Specifically, for example, in the short-distance (0 to 1 Tp) measurement, reflected-light signal S0' is accumulated in the charge accumulation transistor (SG0), reflected-light signal S1' is accumulated in the charge accumulation transistor (SG1), background-light signal BG0 is accumulated in the charge accumulation transistor (SG2), and background-light signal BG1 is accumulated in the charge accumulation transistor (SG3).

The signal amount of S0' and S1' (the reflected-light signals) is greater than that of BG0 and BG1 (the background-light signals), and thus, by determining a combination of two charge accumulation transistors (SG) having a great amount of signals, it is possible to use different distance measurement calculation expressions for short, medium, and long distances with reference to the table illustrated in FIG. 9D, which enables seamless distance measurement covering a wide range from a short distance to a long distance.

Here, the potential change of the unit pixel at the time of exposure will be described with reference to FIG. 11.

Figure 11:
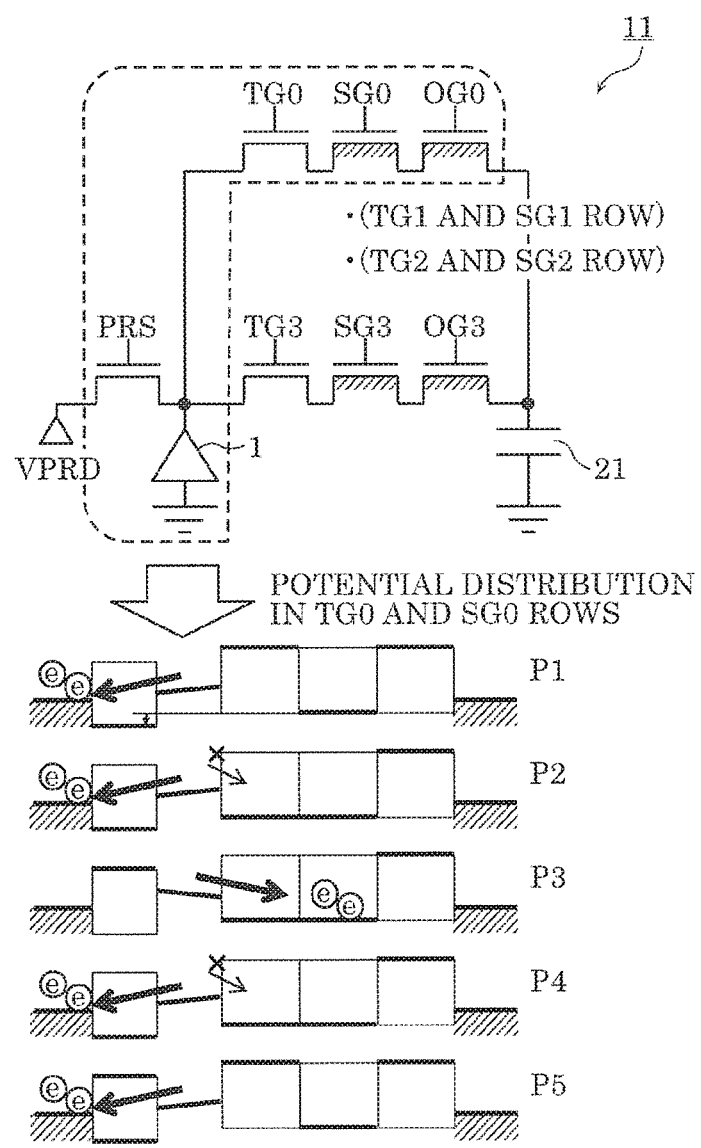
FIG. 11 illustrates transitions of a pixel potential distribution at the time of distance measurement driving of a unit pixel according to Embodiment 2.

FIG. 11 illustrates transitions of a pixel potential distribution at the time of distance measurement driving of a unit pixel according to Embodiment 2. The potential change of the unit pixel at the time of exposure according to Embodiment 2 is basically the same as that according to Embodiment 1.

Specifically, in period P1, read gate TG0 is set to VL, exposure reset gate PRS is set to VH, and all the signal charge resulting from photoelectrical conversion by photoelectric conversion element 1 is discharged to the drain (VPRD) via exposure reset gate PRS. Next, read gate TG0 is switched ON (VH) first, and after a lapse of a certain period P2, exposure reset gate PRS is switched OFF (VL).

In period P2, both read gate TG0 and exposure reset gate PRS are ON (VH), but the potential of exposure reset gate PRS is set higher than the potential of read gate TG0. Thus, most of the signal charge resulting from photoelectrical conversion by photoelectric conversion element 1 flows toward exposure reset gate PRS in the fringing field and is discharged to the drain (VPRD).

Note that in order to set the potential of exposure reset gate PRS higher than the potential of read gate TG0, for example, the threshold voltage of exposure reset gate PRS is set lower than the threshold voltage of read gate TG0. Examples of this approach include setting the p-type impurity concentration of exposure reset gate PRS lower than the p-type impurity concentration of read gate TG0. Alternatively, a DC voltage of approximately 0 to (VH–VL)/2 may be superimposed on exposure reset gate PRS0. Examples of this approach include setting high-level potential VH' of exposure reset gate PRS0 higher than potential VH of read gate TG0.

In period P3, read gate TG0 is ON and exposure reset gate PRS is OFF, and all the signal charge resulting from photoelectrical conversion by photoelectric conversion element 1 is transferred, via read gate TG0, to the charge accumulation transistor (SG0), and accumulated therein; thus, the exposure in the 0 to 1 Tp period is performed.

Next, exposure reset gate PRS is switched ON, and after a lapse of a certain period P4, read gate TG0 is switched OFF; thus, the first exposure sequence is completed. Note that the state of potential in period P4 is the same as the state of potential in period P2, and the state of potential in period P5 is the same as the state of potential in period P1; the same or similar operations are performed.

Although the charge transfer path through read gate TG0 and exposure reset gate PRS0 of unit pixel 11A mentioned above has been described, the same or similar potential change occurs in the charge transfer path through read gate TG1 and exposure reset gate PRS, the charge transfer path through read gate TG2 and exposure reset gate PRS, and the charge transfer path through read gate TG3 and exposure reset gate PRS.

[2-4. Advantageous Effects of Embodiment 2]

(1) Unlike the conventional technique adopting three accumulations with three unit pixels, the drive method according to the present embodiment adopts four accumulations with one unit pixel, allowing four signals necessary for distance measurement to be obtained by one unit pixel.

Figure 12A:
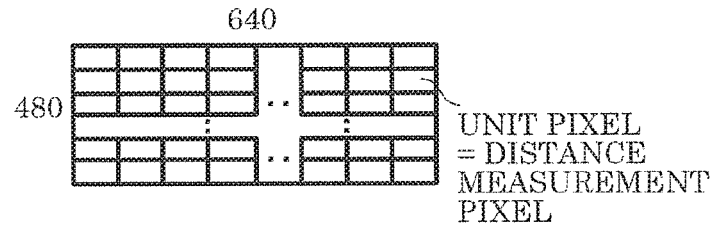
FIG. 12A illustrates that a solid-state imaging device according to Embodiment 2 can reduce an optical size.
Figure 12B:
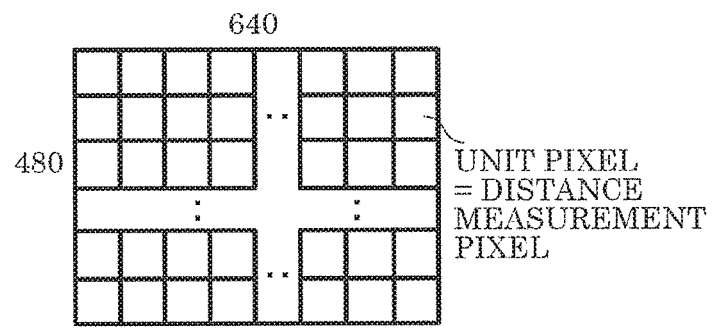
FIG. 12B illustrates that a solid-state imaging device according to Embodiment 2 can enlarge a unit pixel size by a factor of 2.
Figure 12C:
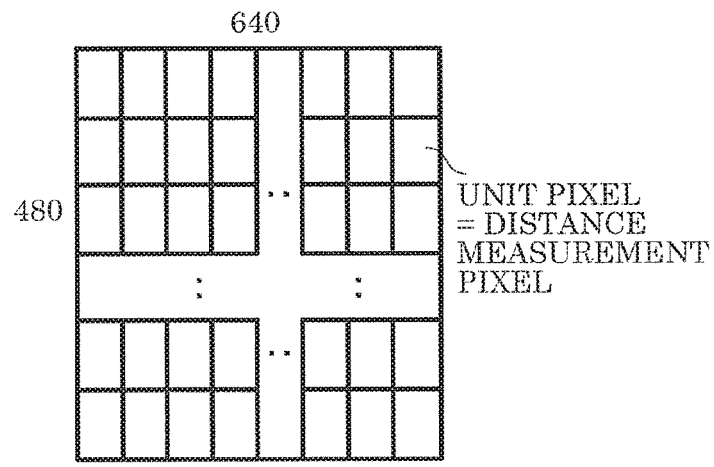
FIG. 12C illustrates that a solid-state imaging device according to Embodiment 2 can enlarge a unit pixel size by a factor of 3.

FIG. 12A illustrates that the solid-state imaging device according to Embodiment 2 can reduce the optical size, FIG. 12B illustrates that the solid-state imaging device according to Embodiment 2 can enlarge the unit pixel size twice that in the related art, and FIG. 12C illustrates that the solid-state imaging device according to Embodiment 2 can enlarge the unit pixel size to three times that in the related art. As illustrated in FIG. 12A, compared to the related art, when the unit pixel size is made the same, the distance measurement pixel size can be reduced, and thus the optical size can be reduced. Alternatively, as illustrated in FIG. 12B, when the optical size is set equivalent to that in Embodiment 1, the unit pixel size can be set to twice that in the related art. Alternatively, as illustrated in FIG. 12C, when the optical size is set equivalent to that in the related art, the unit pixel size can be set to three times that in the related art, allowing significant improvements to pixel properties such as sensitivity and saturation.

Here, the differences occurring in FIG. 12B when the optical size is set equivalent to that in Embodiment 1 are as described in the advantageous effects based on the configuration of the distance measurement pixel (2-2).

Specifically, compared to distance measurement pixel 10 according to Embodiment 1, in distance measurement pixel 11 according to Embodiment 2, the number of read gates TG and the number of charge accumulation gates SG are unchanged, but the number of photoelectric conversion elements and the number of charge reset gates PRS are each reduced from two to one. Therefore, the area of the photoelectric conversion element can be approximately doubled, and the sensitivity per photoelectric conversion element is increased about twofold. In order to determine the distance measurement exposure time, charge reset gate PRS needs to be switched ON and OFF at a pulse width of several ns to several hundred ns. Especially, when a short pulse width is required to improve the distance measurement accuracy, the rising edge time and the falling edge time need be no greater than several ns.

In contrast, with the configuration of distance measurement pixel 11 according to the present embodiment, it is sufficient that one charge reset gate PRS be formed, and thus the photoelectric conversion element can be formed with a wide aperture, compared to that in Embodiment 1. Thus, the sensitivity per photoelectric conversion element can be increased twofold or more.

(2) When S0 and S1 are respectively derived by subtracting the BG component from S0' and S1', S0 is obtained by subtracting BG0 from S0' (=S0+BG0) in the same period of light emission 1, and S1 is obtained by subtracting BG1 from S1' (=S1+BG1) in the same period of light emission 2. Therefore, variations in the sensitivity of the photoelectric conversion elements, the dark current that flows through the photoelectric conversion elements, and the exposure that are caused by the temporal difference in BG light exposure timing (the temporal difference of being the period of light emission 1 or the period of light emission 2) are almost cancelled out, and thus distance measurement variations are reduced.

(3) The drive method according to the present embodiment allows four signals to be obtained by four accumulations with one unit pixel, and allows distinction between short, medium, and long distances by determining the magnitude relationship between S0', S1', BG0, and BG1 signals. Thus, as in Embodiment 1, the distance measurement range can be widened up to 3 Tp (when Tp=11 ns, distance measurement range Zmax is 4.95 m).

(4) The exposure period is determined by switching ON and OFF exposure reset gate PRS in such a manner that exposure reset gate PRS is switched OFF after a lapse of a certain period since read gate TG is switched ON, and read gate TG is switched OFF after a lapse of a certain period since exposure reset gate PRS is switched ON. With this, the exposure time is not affected by variations in the timing for switching ON and OFF read gate TG, and thus improvement can be made to the distance measurement variations, offset, and shading, as in Embodiment 1.

[2-5. Distance Measurement Drive Timing According to Variation]

Figure 13A:
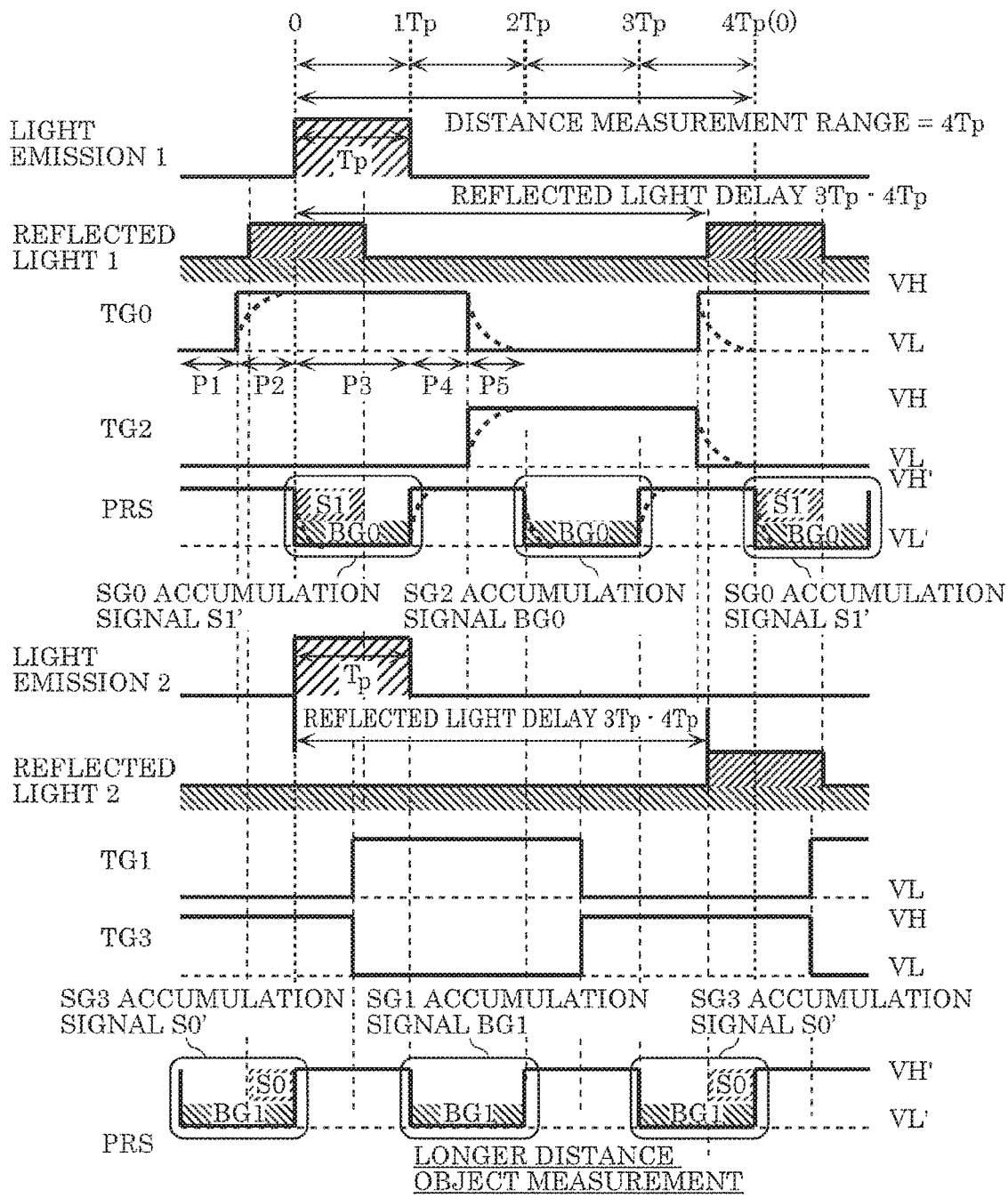
FIG. 13A is a distance measurement drive timing chart for longer-distance measurement of a solid-state imaging device according to a variation of Embodiment 2.
Figures 13B, 14:
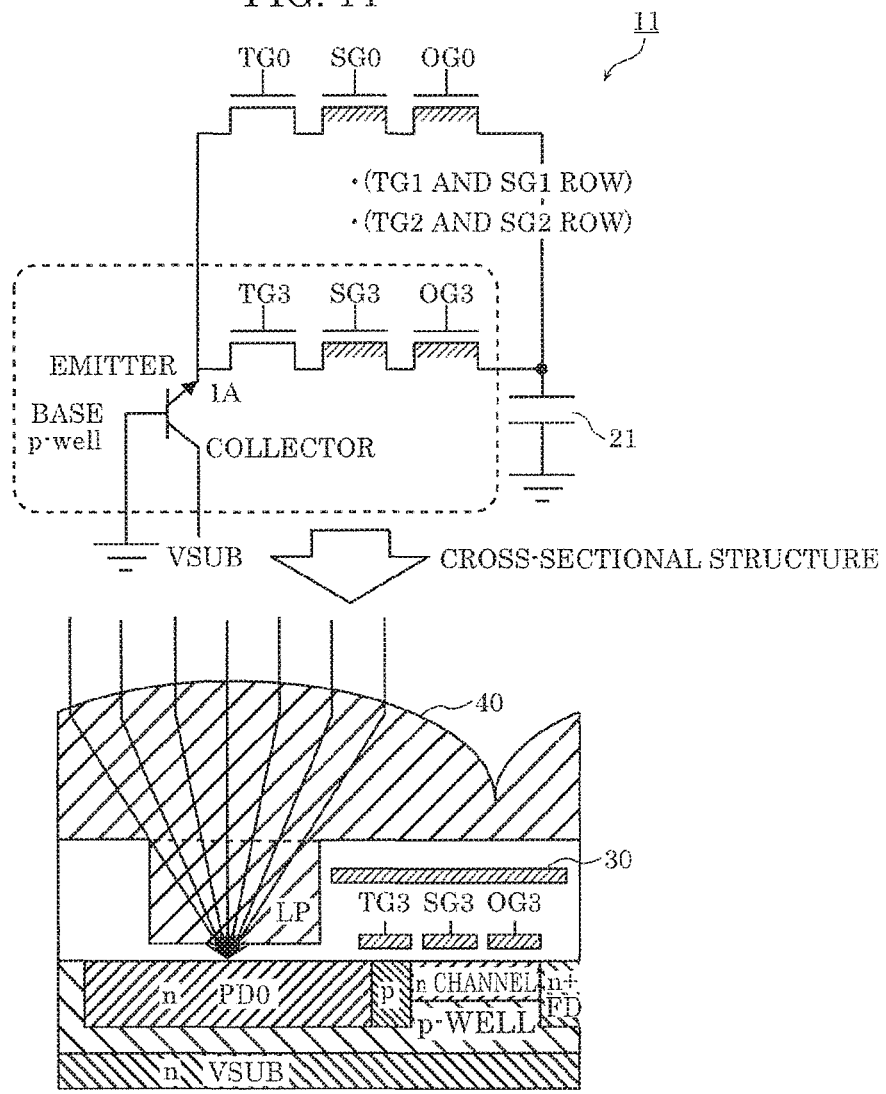
FIG. 13B additionally illustrates a combination of signals obtained by longer-distance measurement.
FIG. 14 illustrates a cross-sectional structure of a unit pixel according to another embodiment.

FIG. 13A is a distance measurement drive timing chart for longer-distance object measurement of a solid-state imaging device according to a variation of Embodiment 2. FIG. 13B additionally illustrates a combination of signals obtained by the longer-distance object measurement. FIG. 13A illustrates the case of an object in which delay time of the reflected light is 3 Tp to 4 Tp (longer distance), and the distance measurement calculation table applied at this time is as illustrated in the table in FIG. 13B.

Although Embodiment 2 describes the case where light is repeatedly emitted in such a manner that the interval between the start of light emission and the next start of the light emission is longer than 4 Tp, the present variation describes the case where the interval between the start of light emission and the next start of the light emission is set to 4 Tp, and the light emission and the exposure are repeatedly performed on a 4-Tp cycle.

As illustrated in FIG. 13A, when signals in the charge accumulation transistor (SG0) and the charge accumulation transistor (SG3) are greater than signals in the charge accumulation transistor (SG1) and the charge accumulation transistor (SG2), it can be determined that the delay amount of the reflected light is between 3 Tp and 4 Tp. Furthermore, at this time, distance L to object 600 can be calculated according to Equations 11 and 12 indicated in Embodiment 1. Note that the determination of short, medium, and long distances according to the magnitude of signals in the charge accumulation transistors (SG0 to SG3) and the distance measurement calculation expressions are the same as or similar to those indicated in Equation 5 to Equation 10.

[2-6. Advantageous Effects of Variation]

Since the exposure of the charge accumulation transistor (SG0) is started in synchronization with the end of the exposure of the charge accumulation transistor (SG3), the charge accumulation transistor (SG3) and the charge accumulation transistor (SG0) can obtain S0' and S1' even if the delay amount of the reflected light is between 3 Tp and 4 Tp. As a result, the distance measurement range can be widened up to 4 Tp (when Tp=11 ns, distance measurement range Zmax is 6.6 m).

Other Embodiments

Although the solid-state imaging device and the method for driving the same according to the present disclosure have been described thus far based on the above embodiments, the solid-state imaging device and the method for driving the same according to the present disclosure are not limited to the embodiments described above. The present disclosure includes other embodiments implemented through a combination of arbitrary structural elements of the above embodiments, or variations obtained through the application of various modifications to the above embodiments that may be conceived by a person having ordinary skill in the art, without departing from the essence of the present disclosure, and various devices such as a distance measurement imaging device in which the solid-state imaging device according to the present disclosure is built-in.

For example, as illustrated in FIG. 3, the charge reset transistor which discharges, to the charge discharger, the signal obtained from the light receiver in the unit pixel according to Embodiment 2 is formed of a metal-oxide-semiconductor (MOS) transistor including an insulating film and a gate electrode film formed above the semiconductor substrate, but this charge reset transistor may be formed of an npn bipolar transistor, which is often used in an interline-transfer capacitive coupling element, as illustrated in FIG. 14.

FIG. 14 illustrates a cross-sectional structure of a unit pixel according to another embodiment. As illustrated in this figure, n-type photoelectric conversion element 1A (PD0) serves as an emitter portion, p-well serves as a base portion, and an n-type substrate electrode (VSUB) serves as a collector portion. The p-well of the base portion is grounded, and when high-level voltage VH' is applied to the n-type substrate electrode (VSUB) of the collector portion, the signal charge resulting from photoelectric conversion by photoelectric conversion element 1A is discharged to n-type substrate electrode VSUB via the p-well. When low-level voltage VL' is applied to VSUB, a potential barrier is formed in the p-well, and the signal charge resulting from photoelectric conversion by photoelectric conversion element 1B is transferred to the charge accumulation transistor (SG0) via read gate TG0, and exposure is performed. Thus, when the charge reset transistor is formed of the bipolar transistor, the parasitic capacitance between the p-well and substrate electrode VSUB is significantly reduced, compared to the parasitic capacitance between exposure reset gate PRS0 and the drain (VPRD) according to Embodiment 2, and furthermore, when the n-type substrate electrode has a high n-type impurity concentration, the substrate resistance of the n-type substrate electrode is significantly reduced; thus, it is possible to make significant improvements to the roundness of the waveform of exposure reset pulse, the delayed timing, etc., that are caused by such parasitic capacitance and substrate resistance. Furthermore, unlike Embodiment 2, there is no need to form exposure reset gate PRS0 and the drain (VPRD) adjacent to photoelectric conversion element 1A, the area, aperture, etc., of photoelectric conversion element 1A can be widened, and thus more improvements to the sensitivity and the saturation are possible than in Embodiment 2.

Note that the solid-state imaging device according to the present disclosure is not required to include light source unit 500 and light source driver 200 which actively emit light toward object 600 unlike solid-state imaging device 1000 according to the present embodiment. The solid-state imaging device according to the present disclosure may obtain luminance information, etc., of object 600 by receiving external irradiating light (including natural light) reflected from object 600.

Specifically, provided is a method for driving a solid-state imaging device including a plurality of unit pixels arranged on a semiconductor substrate and each including: a photoelectric converter; a charge discharger; an exposure resetter which switches timing for accumulating charge in photoelectric converter and timing for discharging the charge from the photoelectric converter to the charge discharger; n charge accumulators which accumulate the charge of the photoelectric converter where n is a natural number; n readers which are provided between the photoelectric converter and the n charge accumulators and read the charge from the photoelectric converter to the charge accumulators; and an outputter which outputs the charge accumulated in the n charge accumulators. The method for driving a solid-state imaging device includes repeating an exposure sequence n times, including: a first reading conduction step of placing the n-th reader in a conducting state in the n-th exposure sequence; a first exposure start step of placing the exposure resetter in a non-conducting state after a lapse of a predetermined period of time starting from the first reading conduction step, and starting exposure of the photoelectric converter; a first exposure stop step of placing the exposure resetter in a conducting state after the first exposure start step, and stopping the exposure of the photoelectric converter; and a first reading non-conduction step of placing the n-th reader in a non-conducting state after a lapse of a predetermined period of time starting from the first exposure stop step.

Furthermore, the abovementioned plurality of unit pixels may include m unit pixels each of which performs the exposure sequence n times to obtain a maximum of m×n signals having different exposure periods.

With this, it is possible to obtain distance measurement signals covering a wide distance measurement range by a small solid-state imaging device with high distance measurement accuracy.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

With a method for driving a solid-state imaging device according to the present disclosure, three-dimensional measurement can be realized by a small solid-state imaging device with high distance measurement accuracy and a wide distance measurement range; therefore, the present disclosure is useful, for example, for a gesture user interface which detects movement of a person, an intrusion detection sensor which detects an object, a person, or the like entering the distance measurement range, and a three-dimensional input device which collects accurate data on the shape of an object in real-time.

What is claimed is:

1. A method for driving a solid-state imaging device which captures a distance measurement image for measuring a distance to an object irradiated with a pulsed beam and includes a plurality of pixels including at least a first pixel including:

a photoelectric converter which receives reflected light from the object and converts the reflected light into charge;

an exposure resetter which switches between exposure and discharge of the charge in the photoelectric converter; and a plurality of readers which read the charge from the photoelectric converter and include at least a first reader and a second reader, the method for driving the solid-state imaging device comprising:

performing a first exposure as the exposure that is performed in a first period which started when a gate of the first reader is turned ON; and performing a second exposure as the exposure that is performed in a second period which is started when a g' of the second reader is turned ON in conjunction with an end of the first period, the first period ending when the gate of the first reader is turned OFF, wherein the plurality of pixels further include:
  at least a second pixel including: the photoelectric converter: the exposure resetter; and a plurality of readers which read the charge from the photoelectric converter and include at least a third reader and a fourth reader, and the method for driving the solid-state imaging device further comprises:
  performing a third exposure as the exposure that is performed in a third period in which a gate of the third reader is ON; and
  performing a fourth exposure as the exposure that is performed in a fourth period which is started in conjunction with an end of the third period and in which a gate of the fourth reader is ON.

2. The method for driving the solid-state imaging device according to claim 1,
wherein the first exposure or the second exposure is started by switching OFF a gate of the exposure resetter after a lapse of a predetermined period of time starting when the gate of the first reader or the second reader is switched ON, and
after the exposure is started, the first exposure or the second exposure is stopped by switching ON the gate of the exposure resetter a predetermined period of time before switching OFF the gate of the first reader or the second reader.

3. The method for driving the solid-state imaging device according to claim 1,
wherein the first exposure is performed in a period overlapping a period in which the pulsed beam is emitted, and
the second exposure is performed in a period in which the pulsed beam is not emitted.

4. The method for driving the solid-state imaging device according to claim 1,
wherein a duration of the second exposure is equal to a duration of the first exposure.

5. The method for driving the solid-state imaging device according to claim 1,
wherein in conjunction with switching ON of a gate of the exposure resetter of the first pixel to stop the first exposure, a gate of the exposure resetter of the second pixel is switched OFF to start the third exposure.

6. The method for driving solid-state imaging device according to claim 1,
wherein in conjunction with switching ON of a gate of the exposure resetter of the first pixel to stop the second exposure, a gate of the exposure resetter of the second pixel is switched OFF to start the fourth exposure.

7. The method for driving the solid-state imaging device according to claim 1,
wherein the third exposure or the fourth exposure is started by switching OFF a gate of the exposure resetter of the second pixel after a lapse of a predetermined period of time starting when the gate of the third reader or the fourth reader is switched ON, and
after the exposure is started, the third exposure or the fourth exposure is stopped by switching ON the gate of the exposure resetter f the second pixel a predetermined period of time before switching OFF the gate of the third reader or the fourth reader.

8. The method for driving the solid-state imaging device according to claim 1,
wherein a duration of the fourth exposure is equal to a duration of the third exposure.

9. The method for driving the solid-state imaging device according to claim 1,
wherein the first exposure is started in conjunction with a start of emission of the pulsed beam.

10. The method for driving the solid-state imaging device according to claim 1,
wherein the first exposure is started in conjunction with an end of emission of the pulsed beam.

11. The method for driving the solid-state imaging device according to claim 1,
wherein the first exposure is started in conjunction with a start of emission of the pulsed beam, and
the third exposure is started in conjunction with an end of emission of the pulsed beam.

12. The method for driving the solid-state imaging device according to claim 1,
wherein a direct-current (DC) bias voltage is superimposed on a drive pulse signal that is supplied to the exposure resetter.

13. The method for driving the solid-state imaging device according to claim 1,
wherein the exposure resetter includes an npn bipolar transistor formed in a semiconductor substrate depth direction in which the photoelectric converter is formed, and
the plurality of readers include a metal-oxide-semiconductor (MOS) transistor.

14. The method for driving the solid-state imaging device according to claim 1,
wherein the exposure resetter and the plurality of readers include a MOS transistor, and
a threshold value of the MOS transistor of the exposure resetter is set lower than a threshold value of the MOS transistor of each of the plurality of readers.

15. The method for driving the solid-state imaging device according to claim 1,
wherein the exposure resetter has a p-type diffusion layer concentration lower than a p-type diffusion layer concentration of each of the plurality of readers.

16. The method for driving the solid-state imaging device according to claim 1,
wherein the solid-state imaging device further includes:
a plurality of charge accumulators which accumulate the charge of the photoelectric converter, and
a floating diffusion which converts a charge signal into a voltage signal.

17. The method for driving the solid-state imaging device according to claim 7,
   wherein the plurality of pixels further include:
      a light-shielding film which shields the plurality of charge accumulators from light.

18. The method for driving the solid-state imaging device according to claim 1, further comprising:
   repeating the exposure n times.

19. The method for driving the solid-state imaging device according to claim 1,
   wherein the plurality of pixels include m pixels, and
   each of them pixels performs the exposure n times to obtain a maximum of mxn signals having different exposure periods.

* * * * *